United States Patent [19]

Rider et al.

[11] Patent Number: 5,361,029

[45] Date of Patent: Nov. 1, 1994

[54] SYSTEM FOR LOCATING MULTIPLE CONCEALED UNDERGROUND OBJECTS

[75] Inventors: Alan J. Rider; Lester R. Querry, both of Reston, Va.

[73] Assignee: The Charles Machine Works, Inc., Perry, Okla.

[21] Appl. No.: 902,525

[22] Filed: Jun. 22, 1992

Related U.S. Application Data

[63] Continuation of Ser. No. 539,616, Jun. 18, 1990, abandoned.

[51] Int. Cl.$^5$ .................. G01V 3/11; G01V 3/165; G01R 19/00; H04B 1/02
[52] U.S. Cl. .................................. 324/326; 324/67; 455/103
[58] Field of Search ............ 324/66, 67, 232, 326–329, 324/335; 379/25; 455/101, 103, 193

[56] References Cited

U.S. PATENT DOCUMENTS

| | | | |
|---|---|---|---|
| 1,900,424 | 3/1933 | Woodbury | 324/66 |
| 3,076,931 | 2/1963 | Jasper | 324/66 |
| 3,418,572 | 12/1968 | Humphreys | 324/67 |
| 3,512,103 | 5/1970 | Berman | 455/103 |
| 3,617,865 | 11/1971 | Hakata | 324/67 X |
| 3,882,287 | 5/1975 | Simmonds | 379/25 |
| 3,991,363 | 11/1976 | Lathrop | 324/67 X |
| 4,010,413 | 3/1977 | Daniel | 324/335 |
| 4,059,795 | 11/1977 | Mordwinkin | 324/233 |
| 4,085,360 | 4/1978 | Howell | 324/67 X |
| 4,118,662 | 10/1978 | Weber | 324/67 X |
| 4,198,596 | 4/1980 | Waeselynck et al. | 324/335 |
| 4,387,340 | 6/1983 | Peterman | 324/326 |
| 4,506,210 | 3/1985 | Chase | 324/66 |
| 4,652,861 | 3/1987 | Domes | 324/67 X |
| 4,691,165 | 9/1987 | Szedlmajer | 324/326 |
| 4,691,204 | 9/1987 | Hiramoto . | |
| 4,818,944 | 4/1989 | Rippingale | 324/67 X |
| 4,896,117 | 1/1990 | Floweredew et al. | 324/326 X |
| 4,901,004 | 2/1990 | King | 324/66 |
| 4,916,444 | 4/1990 | King | 324/66 |

FOREIGN PATENT DOCUMENTS

| | | | |
|---|---|---|---|
| 2523729 | 9/1983 | France | 324/67 |
| 2551217 | 3/1985 | France . | |
| 0143253 | 11/1979 | Japan | 324/67 |
| 1509380 | 5/1978 | United Kingdom . | |
| 2211621A | 7/1989 | United Kingdom . | |

OTHER PUBLICATIONS

"Fault Finders", Industrial Equipment News Magazine, Aug., 1990.
"TELETRAK 2001", Metrotech, Apr., 1990.
"Power Cable/Fault Locator", Dynatel 4420 —3M Product Bulletin, 1990.
"573DX and 573D Sheath Fault/Cable Locators", Dynatel Locators —3M Pub., 1990.
"Dynatel 500A/P Cable Locator and Dynatel 573A/P Earth Return Fault and Cable Locator Operator's Manual", Apr., 1985.

Primary Examiner—Gerard R. Strecker
Attorney, Agent, or Firm—Richards, Medlock & Andrews

[57] ABSTRACT

An improved locator system is provided which simultaneously couples a number of different frequency signals to a number of concealed underground conductive lines, for the purpose of locating and distinguishing between the underground lines. The locator system includes a transmitter which generates the different frequency signals for coupling to the underground lines. A receiver is also provided that detects the different frequency signals and distinguishes between the underground lines. The locator system further provides an arrangement for operating at virtually any frequency within the locating band, and for preselecting an operating frequency that avoids interference from extraneous signals.

16 Claims, 18 Drawing Sheets

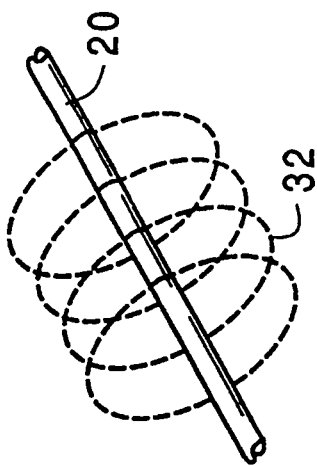
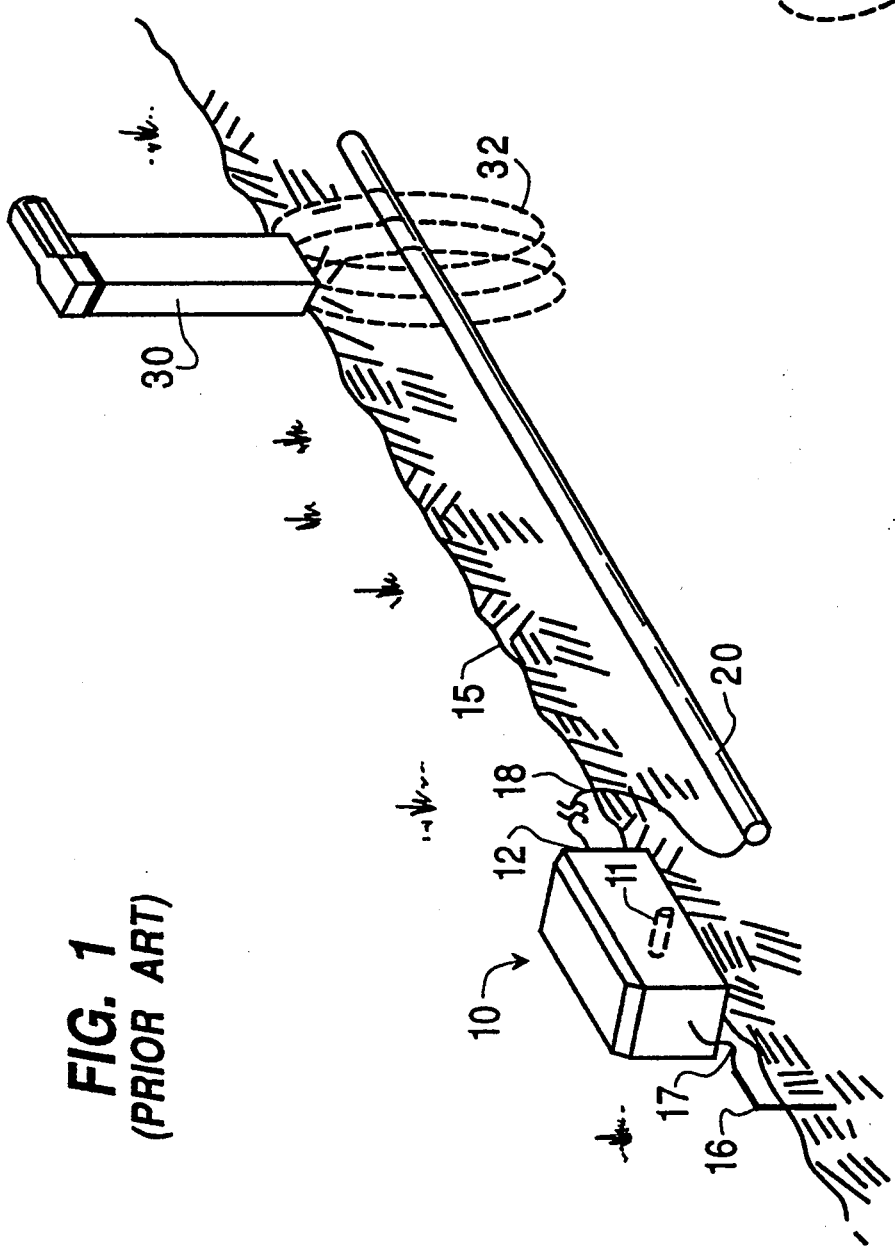
FIG. 1 (PRIOR ART)
FIG. 2

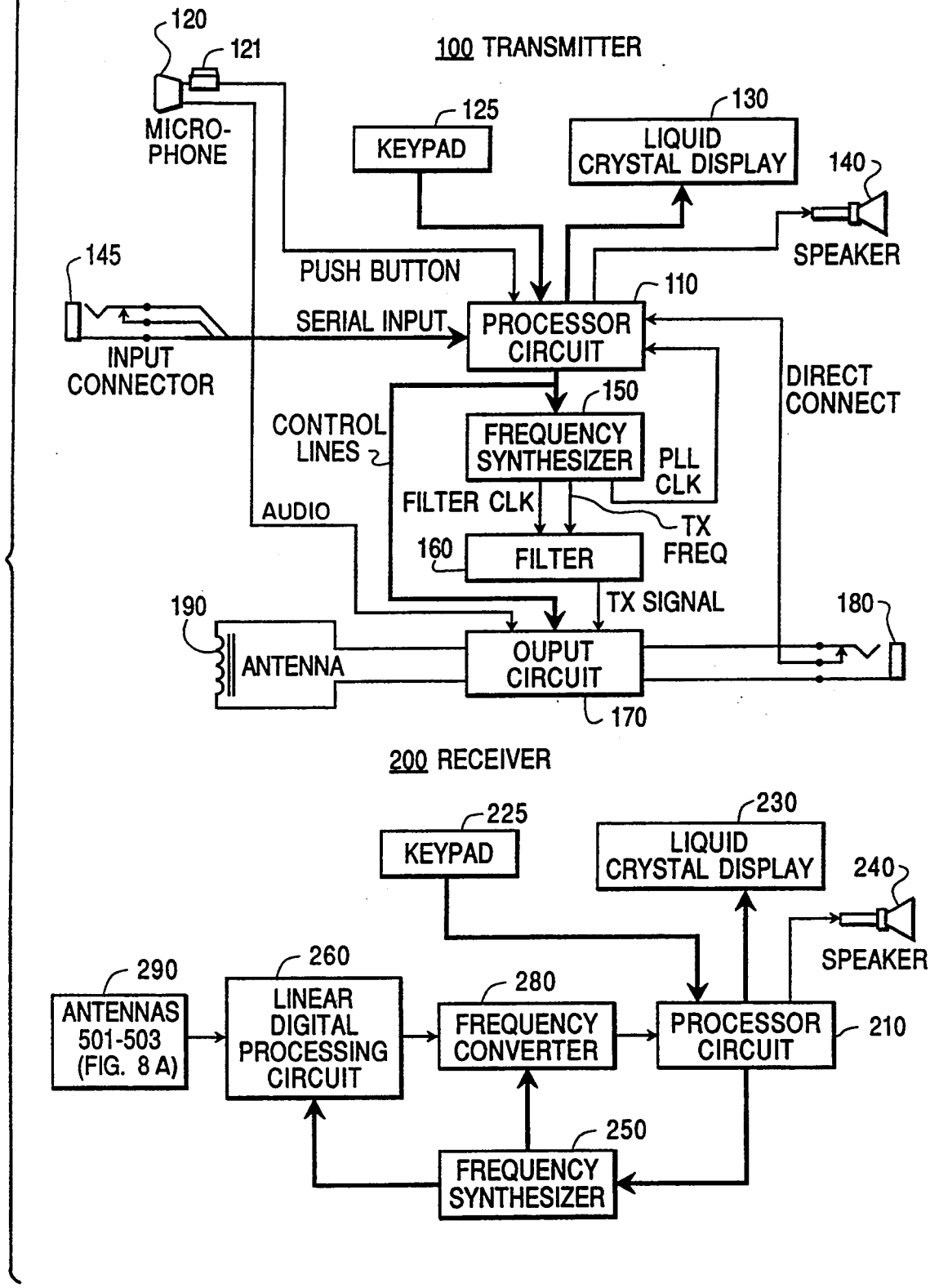

SYSTEM FOR LOCATING MULTIPLE CONCEALED UNDERGROUND OBJECTS

RELATED APPLICATIONS

This is a continuation of U.S. patent application Ser. No. 07/539,616 filed Jun. 18, 1990, now abandoned.

This application is related by subject matter to commonly assigned, copending U.S. patent application Ser. Nos. 539,851, and 539,552, and filed concurrently herewith, now respective U.S. Pat. No. 5,264,795 and 5,231,355.

TECHNICAL FIELD

The present invention generally relates to a system for use in determining the location and orientation of concealed underground objects and, more particularly, to an improved locator system having an arrangement for radiating signals at different frequencies from a plurality of concealed underground objects, and selectively detecting each of the signals at an aboveground location for the purpose of distinguishing between the underground objects. The present invention further provides an arrangement for avoiding signal interference in a locating environment.

BACKGROUND OF THE INVENTION

A variety of devices are used to determine the location and orientation of concealed underground objects. Determining the location of such concealed objects as underground gas, sewer and water pipes, power cables, and telephone and CATV cables or conduits is a necessary prerequisite to excavation and/or the laying of new lines, pipes or cables. For simplicity, these underground objects are hereinafter referred to as underground "lines."

In some applications, an underground steerable boring tool is utilized to form an underground tunnel through which underground lines are subsequently routed. While utilizing a boring tool, it is important for an operator to trace or keep track of the relative location of the existing underground lines with respect to the tool, in order to avoid contacting the existing lines with the tool. In other applications, a trench is excavated and lines are subsequently placed in the open trench. While excavating these trenches, it is equally important for an operator to know the locations of any existing lines in order to avoid contacting them with the excavating equipment.

Special-purpose electromagnetic signal detector systems, which are commonly called "locator systems," have been used for many years to locate and/or trace the path of a boring tool or concealed underground lines. Various types of locator systems exist, but receivers that detect electromagnetic signals radiating from either the underground lines or a small transmitter located within the boring tool are by far the most widely used. Such radiated signals are generally produced in two ways: (1) an alternating current signal from an aboveground transmitting source is induced into an underground conductive line which generates an electromagnetic field around the line, or (2) a signal is radiated from a small transmitter either mounted inside a boring tool or positioned within a non-conductive line.

Generally, two types of signal sources will induce a current in a conductive line which, in turn, will generate an electromagnetic field around the line: active signal sources and passive signal sources. An example of a passive signal source in a locating environment is the signal radiated from a radio broadcast station. When such a signal encounters a portion of a buried conductive line, the signal induces a current in the line, which generates an electromagnetic field around the line. Such a source is called a passive signal source, because it requires no operator intervention to generate the electromagnetic field. The problem with many passive signal sources is that the same signal may be induced into many different lines, which complicates the operator's task of distinguishing between the different lines. Certain passive signal sources, on the other hand, have characteristic radiations that can be used to identify them. For example, CATV cables radiate signals at television synchronization frequencies and harmonics thereof. The present invention permits a locator receiver to be tuned to these characteristic frequencies for passive locating, and tuned to different frequencies for active locating.

Conversely, an active signal source is intentionally utilized by an operator to generate an electromagnetic field directly associated with the line to be traced. For example, an operator may couple a signal having a known frequency to an underground cable, for the purpose of generating a distinct electromagnetic field around the cable. The presence of the distinct electromagnetic field allows the operator to locate the cable and distinguish it from other cables with an aboveground receiver. This ability to distinguish between the cables is a key advantage of an active signal source over a passive source.

As discussed above, a key advantage of an active signal source is the capability of coupling a distinctive frequency signal onto one conductive line, and distinguishing that particular line from adjacent or nearby lines. Consequently, the conductive line of interest can be traced with less confusion or interference from the adjacent lines. Since the frequency of the coupled signal can be controlled precisely, a narrow bandwidth can be used for greater selectivity in the receiver. Also, the use of a narrow bandwidth improves the signal-to-noise ratio and increases the sensitivity of the receiver. The use of a narrow bandwidth in a locator receiver can be especially important for locating conductive lines in the vicinity of a strong radio transmitter, where the airborne signal can swamp out an underground signal unless the airborne signal is filtered out by the receiver's selective, narrow-band circuitry. Another advantage of an active source is that locator calculations of the position and depth of underground conductive lines are not affected by electromagnetic field distortions from multiple signal sources to the same degree as they are with a passive signal source. Thus, a need has developed for multiple transmitter frequencies and narrow-band receiver tuning to avoid interfering signals and improve signal-to-noise ratios. With previous transmitters and receivers, only a few frequencies were provided for these purposes (typically one or two and a maximum of four).

The most practical way to couple a signal to an underground conductive line is simply to attach a wire directly from the transmitter to the line. Such a technique is illustrated in U.S. Pat. No. 4,387,340 to Peterman. If this approach is not feasible, it may be possible to attach the transmitter wire to a toroidal clamp, which is placed around the circumference of the line in order to induce a signal current into the line. The signal induced into the line is then radiated from the line and detected with a locator receiver.

As shown in Peterman, an active signal source is commonly used when an operator desires to locate and trace a specific underground line that is near numerous other lines. A distinctive frequency signal is coupled from a locator transmitter to the line to be traced. For example, the transmitter generates a signal at a specific frequency. A locator receiver is manually set to the specific frequency. A locator receiver is manually set to the frequency of the transmitted signal, and the receiver operator can thereby distinguish the particular line which is radiating the transmitted signal from the other, nearby lines.

More specifically, FIG. 1 illustrates a perspective view of a conventional aboveground locator system utilizing an active signal source. Transmitter 10 is positioned on the surface of earth 15 above buried line 20, which is the concealed object to be traced. Transmitter output connector 12 is connected to wire 18, which is in turn connected to conductive line 20. The connection of wire 18 to line 20 may be accomplished by directly attaching wire 18 to line 20, thus providing an electrical connection therebetween, or by connecting a toroidal clamp (not shown) to wire 18 and placing the clamp around line 20 to thereby induce a current. Thus, the output signal of transmitter 10, which is an AC continuous wave (CW) signal, is induced into line 20. Ground stake 16 is placed deep into the earth and connected to transmitter 10 by ground lead 17, in order to provide a ground return path for the signal current induced into line 20. Consequently, the output signal from transmitter 10, which is at a unique frequency, generates an electromagnetic field that radiates from line 20 with a field pattern such as that illustrated in FIG. 2. Receiver 30 is positioned on the surface of earth 15 in the general vicinity of line 20 and manually set by an operator to the frequency of the transmitted signal. By sensing and processing the signal radiated from line 20, and using conventional locating techniques, the receiver operator locates the position of line 20 and traces the signal along the line's path.

Nevertheless, conventional locator systems are relatively inflexible and inefficient from an operational standpoint, because they are constrained to locating and tracing only one line at a time. Because locating, tracing and distinguishing between multiple, concealed underground lines has become increasingly time consuming and costly, a need has existed in the art of locator system design to provide more flexible and less costly locating techniques and equipment. For example, at a relatively large excavation site, it may be necessary to trace many different lines. Utilizing a conventional active signal source locating system, an operator selects a particular line to be traced, attaches a coupling wire from an aboveground transmitter to the line and a lead from the transmitter to a ground stake, and manually selects a transmitter frequency. Either the same or another operator sets up the locator receiver to receive the transmitted signal (i.e., selects the appropriate receiver frequency) and then proceeds to locate and trace the line of interest. Since the conventional locator transmitter is configured to output only one signal frequency at a time, the operator is limited to tracing one line at a time with that transmitter. Consequently, if more than one line is to be traced simultaneously, then a separate transmitter must be attached to each line to be traced. However, the present invention is not so limited by such constraints. For example, in order to reduce the time required to trace a number of separate lines, without incurring the cost of utilizing a multiple number of separate transmitters, the present invention utilizes one locator transmitter capable of simultaneously coupling a separate frequency signal to each of the lines to be traced. Consequently, each line radiates a unique signal that can be identified by an operator by tuning a receiver to the different frequency on each line of interest.

Interference from extraneous signals creates another problem for conventional locator systems. For example, power lines in the United States radiate signals having a fundamental frequency of 60 Hz. Some other countries' power lines radiate signals at 50 Hz. Although these 50 and 60 Hz signals are not in themselves bothersome in a locating environment (i.e., they are well below the locating frequency band of 1 kHz–100 kHz), signals at their harmonic frequencies are generated that fall within the locating frequency bands. These power line harmonics are of appreciable signal strength and interfere significantly with the reception of the radiated signals from the underground lines. As another example, very low frequency (VLF) radio transmitters radiate signals of enormous power that are used for communicating with submarines. The VLF signals radiated from these transmitters penetrate the earth to a considerable depth and are induced into all conductive lines in the signal path. These signals are then reradiated from the lines. The frequencies of these VLF signals fall within the locating signal bands and also interfere with the radiated signals from the underground lines to be traced. Because of the limited number of frequencies available with conventional locator systems (e.g., one or two), an operator may not have the flexibility needed to avoid receiving a significant amount of interference along with the signals of interest. However, the present invention provides a novel arrangement for transmitting and receiving essentially an unlimited number of different frequency signals within the locating band, which provides the operational flexibility required not only to avoid any extraneous, interfering signals, but also to provide a greater operating range in the presence of interfering signals. The present invention also provides a novel capability of preselecting an operating frequency, in order to minimize the amount of signal interference that likely would be encountered.

SUMMARY OF THE INVENTION

Accordingly, it is an object of the present invention to provide an improved locator system having an arrangement for simultaneously coupling a plurality of signals of different frequencies to a plurality of underground objects, for the purpose of locating and distinguishing between underground objects.

It is a further object of the present invention to provide an improved locator system having an arrangement for generating and selecting virtually any operating frequency within the locating band of frequencies.

It is yet another object of the present invention to provide an improved locator system having an arrangement for automatically discerning which locating frequency bands contain minimal signal interference.

It is yet another object of the present invention to provide an improved locator system having an arrangement for preselecting an operating frequency to minimize the amount of signal interference that likely would be encountered.

It is yet another object of the present invention to provide an improved locator system having an arrangement for selecting an operating frequency to avoid power line harmonic frequencies.

It is yet another object of the present invention to provide an improved locator receiver having an arrangement for selecting an operating frequency that corresponds to the characteristic frequency of a passive signal source.

It is yet another object of the present invention to provide an improved locator transmitter that simultaneously transmits multiple identification codes over the signals radiated from multiple underground lines for the purpose of distinguishing between the multiple lines, and an improved locator receiver that receives and processes the identification codes.

It is yet another object of the present invention to provide an improved locator system that reduces operational time and costs.

In accordance with the present invention, an improved locator system is provided which simultaneously couples a number of signals of different frequencies to a number of concealed underground conductive lines, for the purpose of locating and distinguishing between the underground lines. The locator system includes a transmitter which generates the different frequency signals for coupling to the underground lines. A receiver is also provided that detects the signals of different frequencies and distinguishes between the underground lines. The locator system further provides an arrangement for operating at virtually any frequency within the locating band, and for preselecting an operating frequency that avoids interference from extraneous signals.

BRIEF DESCRIPTION of THE DRAWINGS

A more complete appreciation of the present invention and many of the attendant advantages thereof will be readily obtained as the invention becomes better understood by reference to the following detailed description when considered in connection with the accompanying drawings.

FIG. 1 illustrates a perspective view of a conventional aboveground locator system for locating an underground conductive line.

FIG. 2 illustrates the electromagnetic field produced by a current-carrying conductor.

FIG. 14 is another electrical block diagram of the locator system of FIG. 3.

DETAILED DESCRIPTION OF THE PREFERRED EMBODIMENTS

Figure 3:
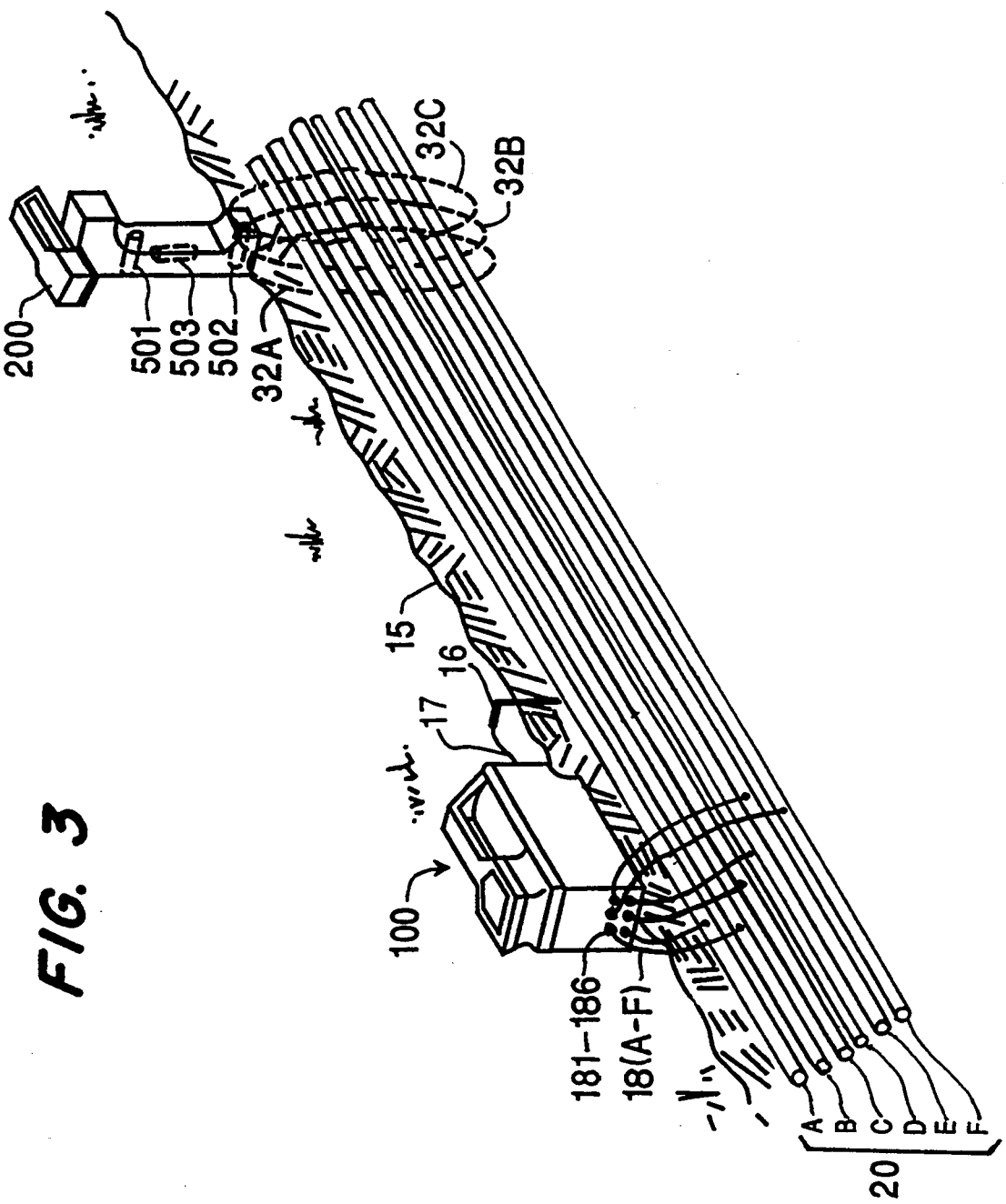
FIG. 3 illustrates a perspective view of an improved aboveground locator system in accordance with a preferred embodiment of the present invention.

Referring to the drawings in detail, wherein like numerals indicate like elements, FIG. 3 illustrates a perspective view of an improved aboveground locator system in accordance with a preferred embodiment of the present invention. A related, improved locator system which is capable of transferring digital and analog information from a locator transmitter to a locator receiver, by impressing the information on the carrier signal used for locating a concealed underground object, is disclosed and claimed in commonly-assigned, copending U.S. patent application Ser. No. 539,851 entitled "System For Locating Concealed Underground Objects Which Transmits Digital Or Analog Information", now U.S. Pat. No. 5,264,795, which is expressly incorporated herein by reference.

As described in more detail below, the locator system of FIG. 3 includes improved transmitter 100, which provides a plurality of output signals at different frequencies for coupling to and simultaneously tracing a number of different lines. Each of the output signals is generated by a frequency synthesizer, which provides an operator with the flexibility to select essentially an unlimited number of different frequency signals to be transmitted within the locating band. A frequency synthesizer is also included in improved receiver 200, which permits more precise tuning of the receiver in order to provide greater frequency selectivity. This frequency synthesizer also provides an operator with the flexibility to select a relatively large number of receiver operating frequencies. Consequently, the present transmitter's and receiver's operating frequencies may be selected so as to avoid or minimize the effects of extraneous signals typically found in a locating environment, such as power line harmonics, VLF radio broadcast signals, or relatively high ambient signal noise in certain locating frequency bands.

Figure 4:
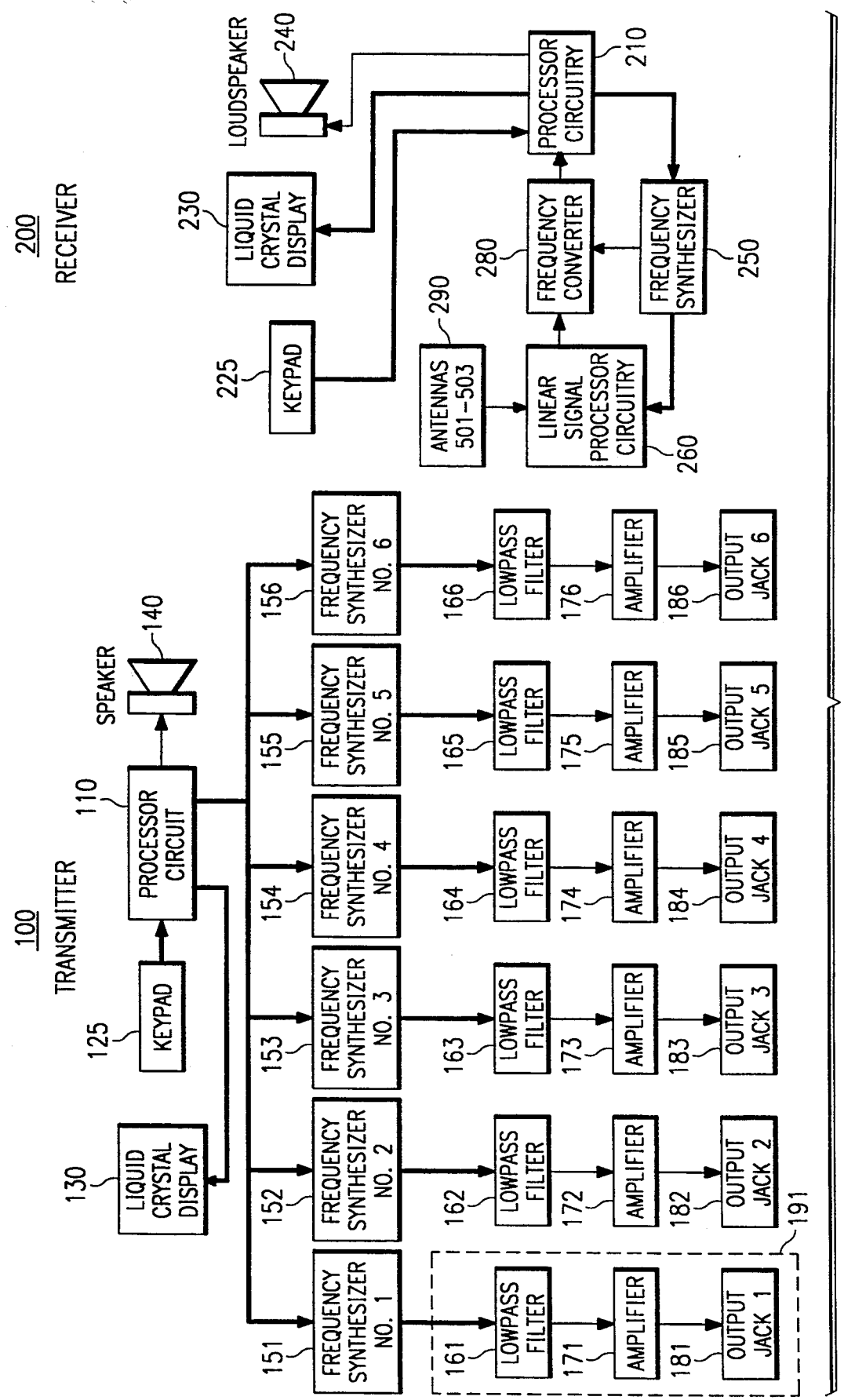
FIG. 4 is an electrical block diagram of the locator system of FIG. 3.

FIG. 4 illustrates an electrical block schematic diagram of the locator system shown in FIG. 3. With respect to the following detailed description, it is noted that the structures and operations of specific electronic circuit arrangements are provided for illustrative purposes only. Thus, any specific component reference by manufacturer's Model No. is disclosed by way of example only. It is not intended that the present invention should be limited to the specific components described thereto. Any appropriate circuit arrangement may be utilized that can provide the present invention's novel functions of coupling a plurality of signals from a locator transmitter to a plurality of underground lines and detecting the plurality of signals radiated from the lines with a locator receiver, in order to distinguish between the lines.

A Multiple Output Locator Transmitter

Referring to FIGS. 3 and 4, transmitter 100 includes processor circuit 110, which is a digital processor and its associated circuitry that coordinates and controls all functions of transmitter 100. Processor circuit 110 includes microcontroller 111 (FIG. 5) that provides control signals over control lines to all of the digitally-controlled components of transmitter 100. The specific technique of addressing individual digital circuit components and transferring data to them is well known and not shown in detail in the drawings. An operator (not shown) inputs commands to processor circuit 110 using keypad 125. Processor circuit 110 communicates information back to the operator using liquid-crystal display 130 and speaker 140. A more detailed description of the command and communications interface circuit between the operator and transmitter 100 is disclosed in commonly-assigned, copending U.S. application Ser. No. 539,552, entitled "Locator Transmitter Having An Automatically Tuned Antenna", now U.S. Pat. No. 5,231,355, which is expressly incorporated herein by reference.

The plurality of different frequency signals which are supplied by transmitter 100 for coupling to separate lines, are provided by, for example, six identical transmitting circuits. Although a preferred embodiment is shown which includes six identical transmitting circuits for illustrative purposes, the present invention is not intended to be limited thereto. Any plural number of transmitting circuits may be provided, in which the number is limited only by the design constraints of a locating system. Generally the six different signals are generated by respective frequency synthesizers 151–156, filtered through digitally controlled lowpass filters 161–166, amplified by power amplifiers 171–176, and coupled to output jacks 181–186. Separate connecting wires 18A–F are coupled between output jacks 181–186 and respective lines 20A–F to be traced. Processor circuit 110 provides separate control signals to each transmitting circuit, in order to control the frequencies, filtering and amplification of the separate signals to be transmitted.

Figure 5:
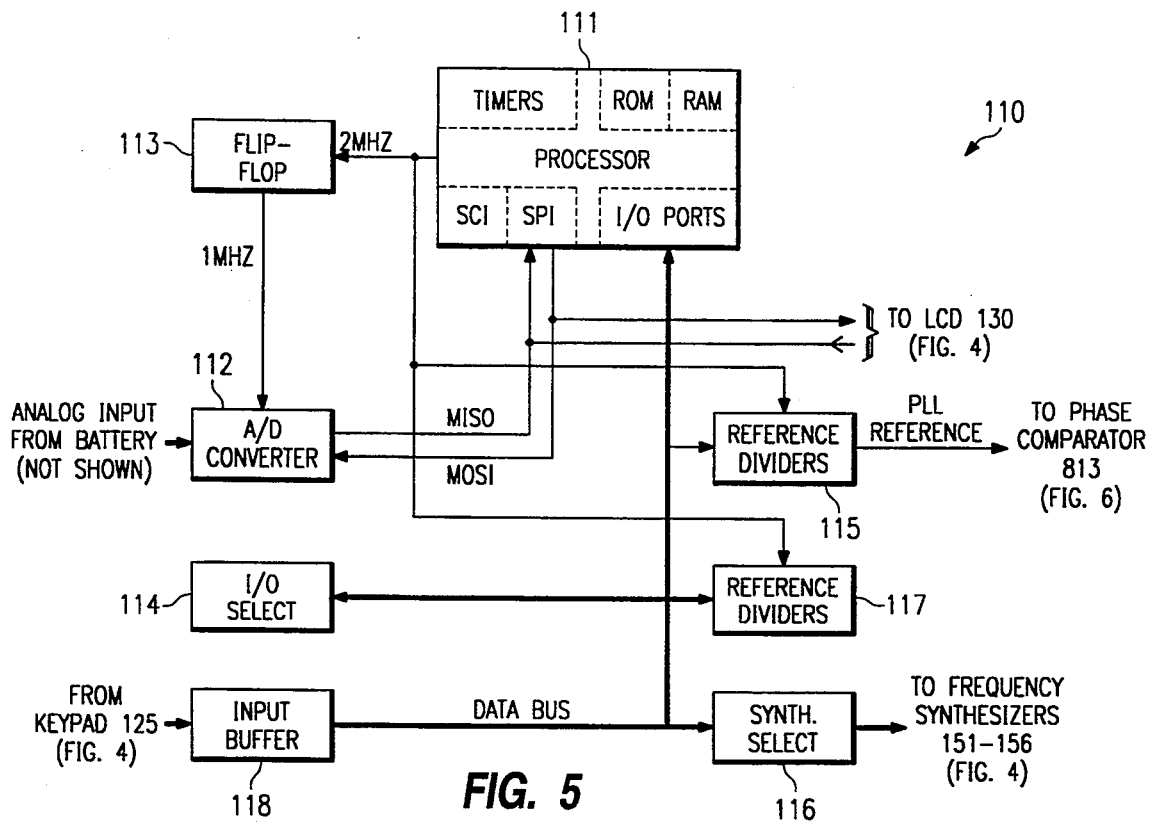
FIG. 5 is an electrical block schematic diagram of the transmitter processor circuit of FIG. 4.

The details of transmitter processor circuit 110 are shown in FIG. 5. Referring to FIG. 5, microcontroller 111 comprises a processor, read-only memory (ROM), random-access memory (RAM), an asynchronous bidirectional serial communications interface (SCI) integral with a baud rate generator, a synchronous bidirectional serial peripheral interface (SPI), a timer system, and input-output ports (I/O ports). All of the above-described components may be located on an individual semiconductor chip. In a preferred embodiment of the present invention, microcontroller 111 comprises a Motorola MC68HC705C8 type microcontroller. Analog-to-digital (A/D) converter 112, which may, for example, comprise an 11 channel, 8 bit Motorola MC45040P2 type A/D converter, is connected to microcontroller 111 through the microcontroller's bidirectional SPI port. A 1-MHz clock signal for A/D converter 112 is provided by a 74HC74 type flip-flop circuit 113, which divides the microcontroller's crystal-controlled frequency of 2 MHz in half. I/O select circuit 114 comprises a 74HC138 type 1-of-8 decoder which generates select signals from the signals on three of the I/O port lines of microcontroller 111. Reference dividers 115 and 117 comprise 82C54 type programmable counter/timers, each including three individual 16-bit counters. One counter is used with each of the six frequency synthesizers. The counters' functions are described below in connection with FIG. 6. Synthesizer select decoder 116 comprises another 74HC138 type 1-of-8 decoder, which generates additional select signals that allow microcontroller 111 to select and control the individual frequency synthesizers. Input buffer 118 provides an interface for keypad 125 with the processor's data bus. Information is sent to liquid-crystal display 130 (FIG. 4) for display, using the MISO and MOSI serial data lines of the SPI port in microcontroller 111.

An analog input signal (battery supply) which is to be measured and monitored, is coupled to A/D converter 112, which then provides the battery signal in digital form (MISO) to the SPI in microcontroller 111. The present invention is not limited to providing just a battery supply analog input signal. Other analog input signals may be provided to A/D converter, such as regulated power supply voltages, circuit board temperature, and transmitter output voltage and output current.

Figure 6:
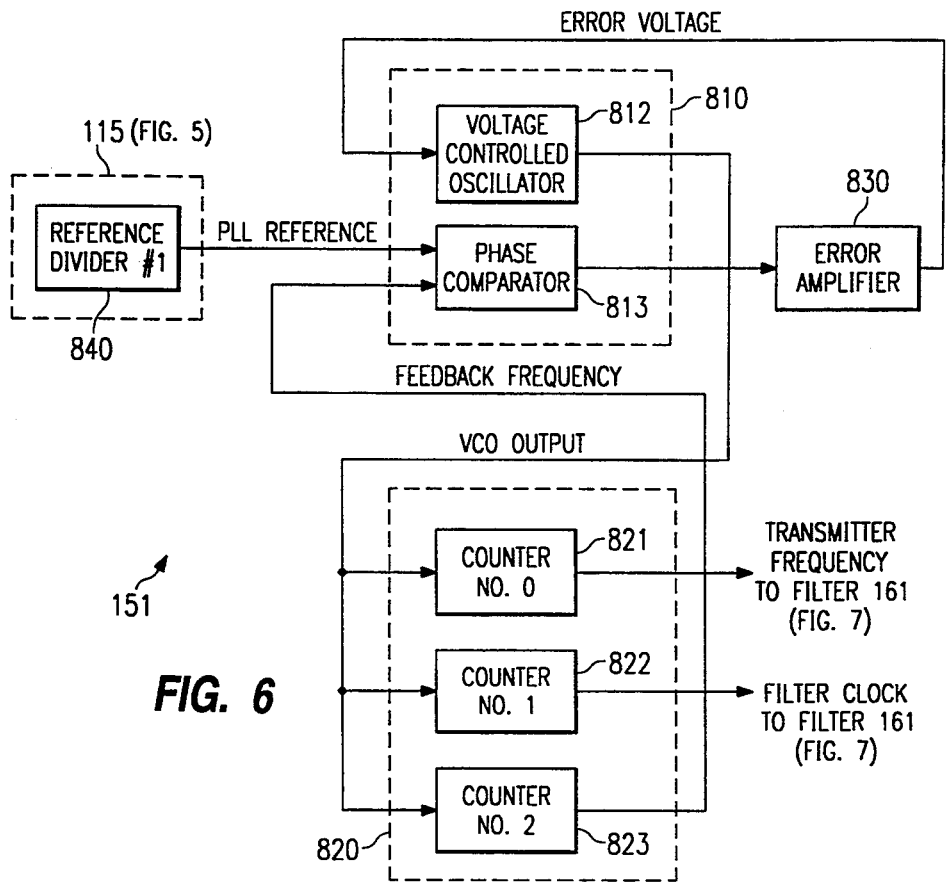
FIG. 6 is an electrical block schematic diagram of one of the identical phase-locked loop, frequency synthesizer circuits of FIG. 4.

For illustrative purposes, the detailed structure of only one of the six identical phase-locked loop, frequency synthesizer circuits (circuit 151) of FIG. 4, is shown in FIG. 6. Each frequency synthesizer circuit generates the basic carrier frequencies to be coupled to each respective output circuit in FIG. 4. Referring to FIG. 6, reference divider 840, which is one of the three counters in reference dividers 115 (FIG. 5), divides the 2 MHz clock to produce signal PLL REFERENCE. Phase-locked loop (PLL), frequency synthesizer 810 may, for example, comprise a 74HC4046 type phase-locked loop integrated circuit, including error amplifier 830, voltage-controlled oscillator (VCO) 812 and phase comparator 813. Counter/timer 820 comprises an Intel 82C54 type integrated circuit including 16-bit programmable counter/dividers 821–823 that may be individually controlled and programmed by microcontroller 111 (FIG. 5) to generate an output signal of the desired frequency. Error amplifier 830 comprises an MC33172 type operational amplifier. The use of a PLL frequency synthesizer in accordance with a preferred embodiment of the present invention, allows a microcontroller to select virtually any frequency within the usable range of frequencies, with a high degree of stability and accuracy. The numerous advantages of providing such a capability are described above in the first paragraph of the detailed description.

The output signal (VCO OUTPUT) from voltage-controlled oscillator 812 is coupled to the clock inputs of counters 821, 822, and 823. The output signal TRANSMITTER FREQUENCY from counter 821 is at the fundamental frequency to be provided by transmitting circuit 151 of FIG. 4. The output signal FEEDBACK FREQUENCY from counter 823 is coupled to an input of phase comparator 813. A phase-locked loop reference signal (PLL REFERENCE) from reference divider 840 (in reference dividers 115 of FIG. 5), is coupled to the other input of phase comparator 813. The output signal from phase comparator 813 is coupled through error amplifier 830 to an input of voltage-controlled oscillator 812. The signal FILTER CLOCK from the output of counter 822 is coupled to lowpass filter 161 in FIG. 7, in order to control the tuning of lowpass filter 161.

For operating as shown in FIG. 6, microcontroller 111 programs reference divider 840 and feedback counter 823 so as to create a particular voltage-controlled-oscillator frequency which, when divided by counters 821 and 822, produces the desired transmitter frequency and filter clock. The phase-locked loop (PLL) component 810 functions so as to produce signal VCO OUTPUT, which, when divided by counter 823, equals the frequency PLL REFERENCE provided by reference divider 840. Phase comparator 813 produces an error voltage proportional to the phase error between the two input signals (and frequency error prior to "lock"). This error voltage is then amplified by error amplifier 830 to decrease the phase error between the reference signal and the feedback signal from counter 823. Error amplifier 830, also serves to significantly minimize "phase jitter" introduced by phase comparator 813. Voltage-controlled oscillator 812 produces a frequency proportional to the output of error amplifier 830, which in turn drives feedback counter 823, which generates the feedback signal to phase comparator 813.

There are two basic modes of operation for the PLL frequency synthesizer. One mode is when the PLL is not in "lock." This occurs immediately following reprogramming of the counters by microcontroller 111, prior to the loop stabilizing. Whenever the counters are reprogrammed, it should be assumed that the frequencies at the inputs of the phase comparator will be quite different. Phase comparator 813 and error amplifier 830 send a feedback error voltage to voltage-controlled oscillator 812 so as to cause it to increase or decrease frequency as required to make the frequency from feedback counter 823 equal to the frequency from reference counter 840. When the two frequencies are equal, phase comparator 813 continues to produce an error voltage, which again is amplified by error amplifier 830, minutely adjusting voltage-controlled oscillator 812 so as to make the phases of the two input signals to phase comparator 813 equal. The resultant signal VCO OUTPUT is divided by counters 821 and 822 to produce the desired transmitter and filter clock frequencies.

To illustrate the process with typical numerical values, assume the desired transmitter frequency is 8,010 Hz and the desired filter clock is 35 times 8,010 Hz, or 280.35 kHz. Microcontroller 111 (FIG. 5) programs reference divider 840 to divide its 2 MHz clock by 1498, producing signal PLL REFERENCE with a frequency of 1,335.11 Hz. Similarly, microcontroller 111 programs feedback counter 823 to divide by 5040. Thus, signal VCO OUTPUT equals 1,335.11 times 5040, or 6.72897 MHz. Microcontroller 111 programs transmitter frequency divider 821 to divide by 840 and filter clock divider 822 to divide by 24. These divisions yield a transmitter frequency of 8,010.68 Hz and a filter clock frequency of 280,374 kHz, which frequencies are sufficiently close to the desired values.

It is to be noted that the generation of one signal frequency has been described with respect to frequency synthesizer 151 (FIG. 4) for illustrative purposes only, but the present invention is not intended to be limited thereto. Each transmitter frequency synthesizer of the present invention is capable of providing thousands of discrete frequency signals across the locator signal frequency spectrum. Also, the number of frequency synthesizers and transmitting circuits illustrated in FIG. 4, is a matter of design preference and is not intended to act as a limitation on the present invention.

Figure 7:
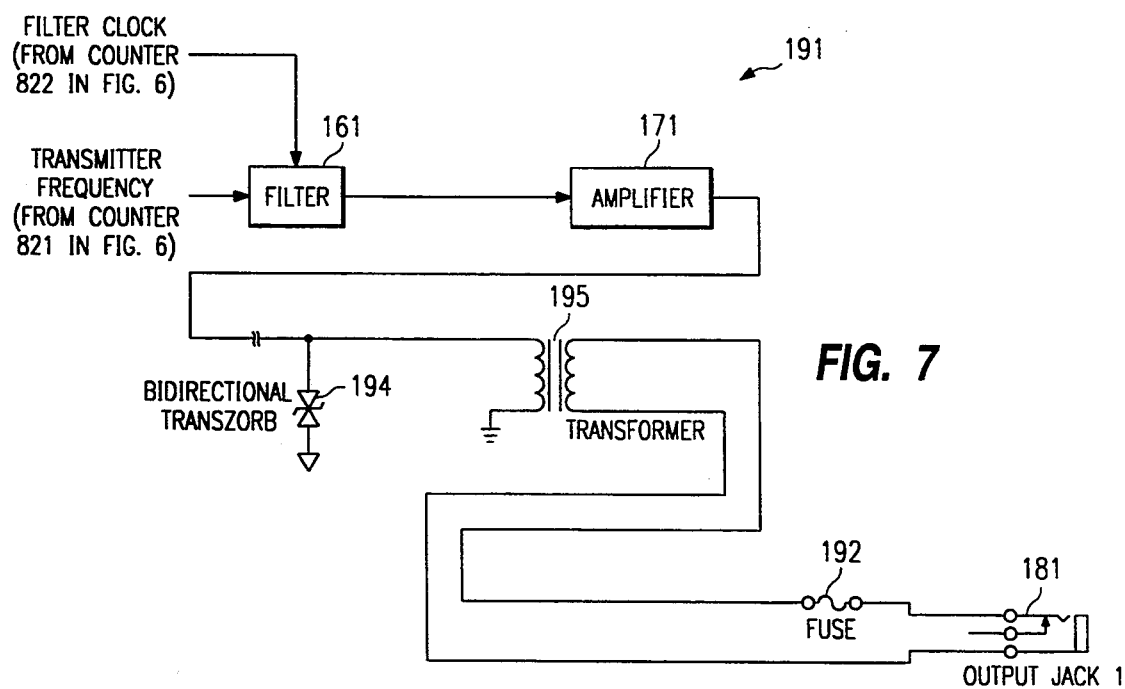
FIG. 7 is an electrical block schematic diagram of one of the identical transmitter output circuits of FIG. 4.

The details of output circuit 191 in FIG. 4 are shown in FIG. 7. Referring to FIG. 7, filter 161 is a digitally controlled filter comprising an LMF100C type switched-capacitor further including two sections which are connected in cascade and configured as a multi-order lowpass filter. The signal TRANSMITTER FREQUENCY from counter 821 in FIG. 6 is coupled to an input of filter 161. Filter 161 is tuned by the signal FILTER CLOCK from counter 822 in FIG. 6. The output signal from filter 161 is coupled to an input of amplifier 171, which comprises an LM388 type power amplifier. The output signal from amplifier 171 is capacitively coupled to an input winding of transformer 195. In order to protect the circuitry from fault conditions at the output which may be coupled through transformer 195, a P6KE16CA type bi-directional transient absorber (tranzorb) device 194 is connected across the input winding of transformer 195. The signal from the output winding of transformer 195 is coupled through fuse 192 to output jack 181. Fuse 192 is provided to protect the output circuitry and transmitter 100 in the event that the output is inadvertently connected to a live power line or other voltage source.

Thus, an extremely precise frequency signal is generated by frequency synthesizer 151, filtered and amplified in output circuit 191, and coupled to one of the plurality of underground lines to be located and traced.

Avoidance of Interfering Signals

A feature of the present invention is the capability of providing any one of a number of extremely precise frequency signals from each of the transmitter's output circuits. This feature allows an operator to select transmitter frequencies that are well clear of ambient signals that are expected to cause interference, such as power line harmonics or VLF frequency signals. For example, the TRANSMITTER FREQUENCY signal of 8,010 Hz described above with respect to the programming of counters 821–823 in FIG. 6, has been selected intentionally because that frequency is midway between the nearest harmonics of 60 Hz, or the power line harmonics in the United States. The 133rd harmonic of 60 Hz is at 7,980 Hz and the 134th harmonic is at 8,040 Hz. Therefore, by transmitting a signal at 8,010 Hz and using a bandpass of about 10 or 20 Hz, the present locator receiver achieves a very high degree of rejection for these 60 Hz harmonics. Similarly, it is possible to devise operating frequencies in the present system utilizing the above-described frequency generation techniques, in order to avoid 50 Hz harmonics such as those encountered in European countries.

Additionally, it is possible to select a precise frequency to be transmitted that avoids interference at the present receiver from such signals as VLF radio broadcast signals. As described in more detail below with respect to an improved locator receiver, a microcontroller in the receiver is capable of tuning the receiver to numerous frequencies within various locating bands. Thus, the receiver may be selectively tuned to a transmitted frequency which avoids the interfering VLF signals. Also, such a processor-controlled receiver may be operated to scan the locating frequency bands, monitor the signal energy in each band, and select an operating frequency in a frequency band having the lowest ambient noise level.

Referring to the transmitter 100 of FIG. 14, frequency synthesizer 150 produces signal TX FREQ, which is the frequency of the output carrier signal. The signal provided by frequency synthesizer 150 is a square-wave. This square wave signal is filtered by filter 160, which removes the harmonics from the square-wave signal TX FREQ and produces a relatively pure, sine-wave output labeled TX SIGNAL. The harmonics are removed in order to limit extraneous signals from frequency synthesizer 150, which may interfere with nearby but unassociated electronic components. Filter 160 is tuned to the frequency of TX FREQ signal by clock signal FILTER CLK from frequency synthesizer 150. If an operator desires to change the frequency of the transmitted carrier signal, the desired change is applied to microcontroller 111 via keypad 125. Microcontroller 111 commands frequency synthesizer 150 to change the frequency of the TX FREQ signal and also change the frequency of the FILTER CLK signal to filter 160, in order to shift the center frequency of filter 160 to that of the new frequency. Also, as described in more detail below with respect to the operation of receiver 200, transmitter 100 encodes a digital "command code" onto the carrier signal in order to cause receiver 200 to display the new transmitter frequency to the receiver operator. Thus, the receiver operator may then set the new frequency in the receiver.

Transmission of Digital Information

Figure 15:
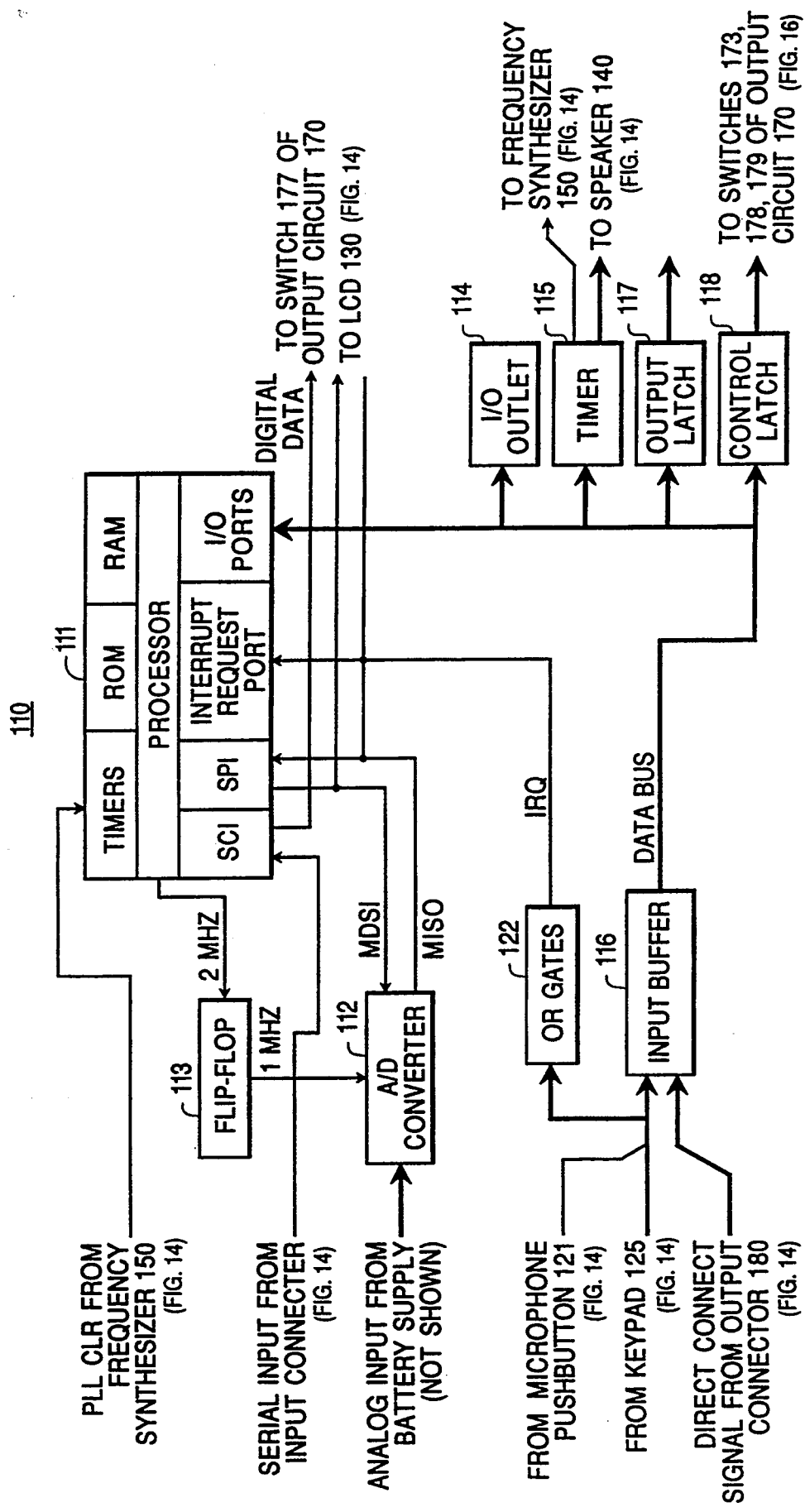
FIG. 15 is an electrical block schematic diagram of the transmitter processor circuit of FIG. 14.
Figure 16:
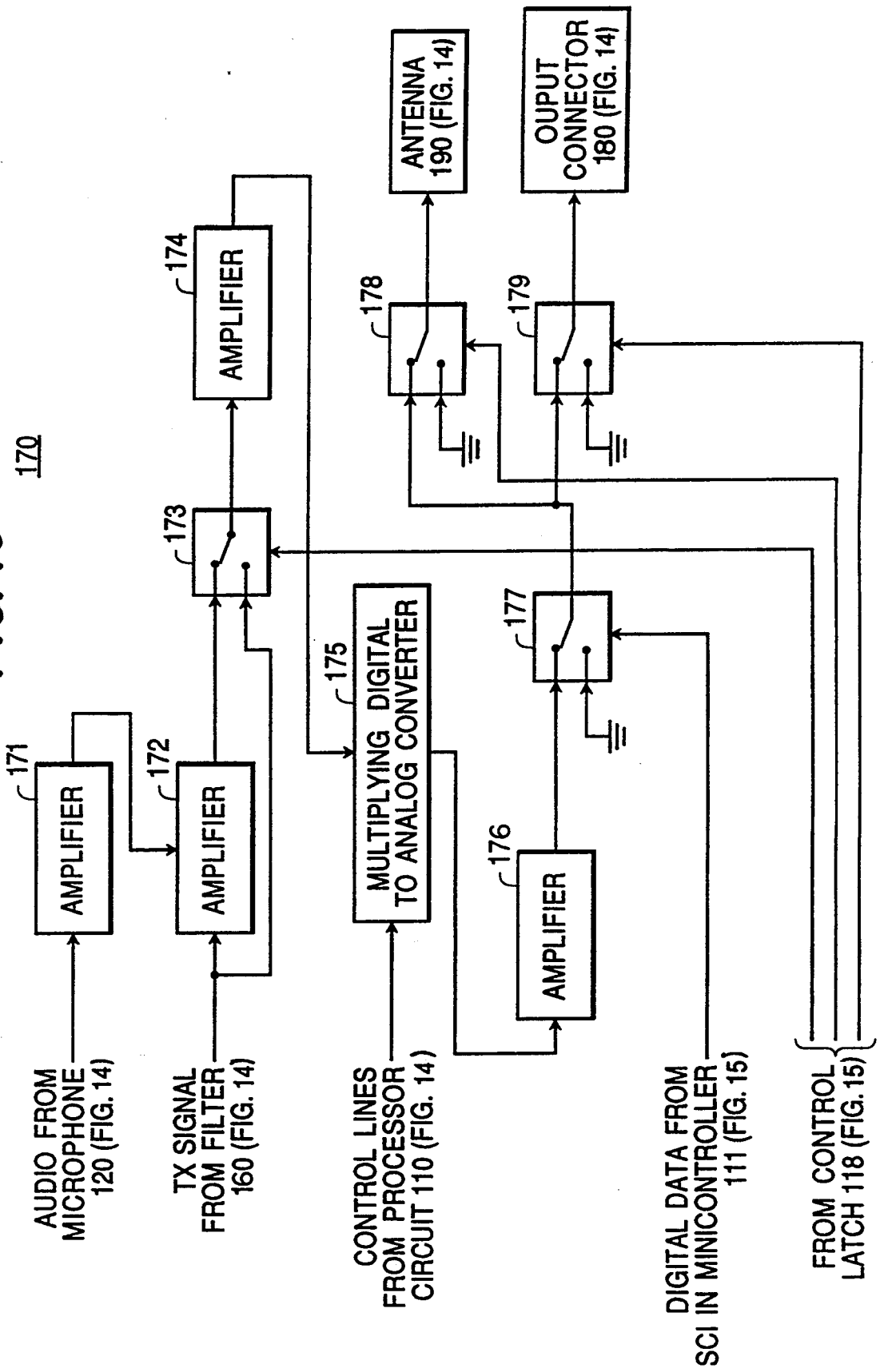
FIG. 16 is an electrical block schematic diagram of the transmitter output circuit of FIG. 14.

As disclosed above, a novel aspect of the present invention is the capability to transmit digital information utilizing the carrier signal normally established between a locator transmitter and receiver. Although an amplitude modulation technique for transmitting digital information is disclosed herein for illustrative purposes, the present invention is not intended to be limited thereto. Any one of a number of well known modulation techniques may be substituted for amplitude modulation. Referring to FIGS. 15 and 16, microcontroller 111 initializes an internal timer to interrupt the processor after a certain interval. When the interval has ended, microcontroller 111 programs its internal SCI for the correct data format, baud rate, etc. and loads a data byte, representing the information to be transmitted, into the SCI. The output of the SCI is in standard asynchronous serial Non Return to Zero (NRZ) mark/space format, with an 8-bit data word, odd parity, and one stop bit. The output of the SCI is coupled to the digital data input of switch 177. The signal DIGITAL DATA from the SCI causes switch 177 either to pass the carrier signal for transmission, in one position of the switch, or couple the signal to ground in the other position. In the idle condition (mark), the control input to switch 177 goes high and the output of amplifier 176 is connected through switch 177 to its output. When the control input to switch 177 goes low (space), the grounded input of switch 177 is connected to its output. Consequently, the carrier signal from amplifier 176 (the transmitter's carrier signal) is amplitude encoded (turned on and off), in response to the digital signal pattern provided at the output of the SCI in processor circuit 110.

Digital information is encoded onto the transmitted carrier signal utilizing the following data protocol. The first serial data byte transmitted (represented by the data at the output of the SCI) includes a category code which defines the category or type of data being transmitted. For example, one category code may indicate that an ID code is being transmitted, while another category code may indicate that a product code is being transmitted. More specifically, an ID code may be used to indicate the identity of a specific signal from a transmitter. If multiple transmitters are required simultaneously to trace multiple lines, then each transmitter may generate a different ID code in order to permit a receiver operator to distinguish between the different signals and lines. A product code may be used to permit a receiver operator to determine the particular type of transmitter in use such as, for example, a subterranean transmitter or a particular model of aboveground transmitter.

Figure 20:
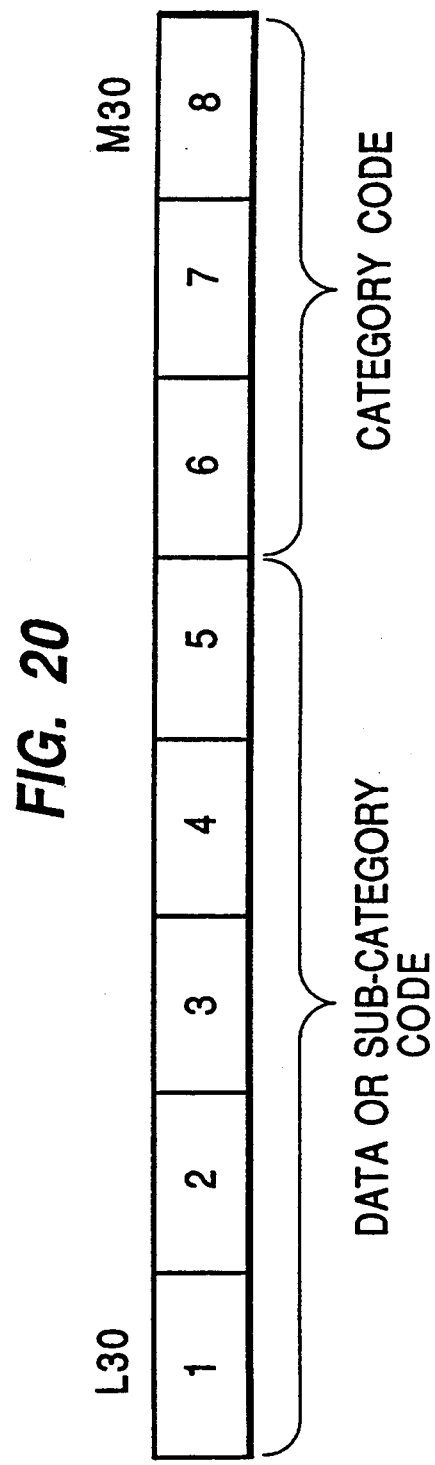
FIG. 20 illustrates a byte format representing categories of encoded information that may be transmitted in accordance with a preferred embodiment of the present invention.

FIG. 20 illustrates a byte format representing categories of encoded information (category codes) that may be transmitted in accordance with a preferred embodiment of the present invention. Referring to FIG. 20 and the chart below, the category codes are numbered 0 through 7, and are represented by the states of bits 6 through 8. The eight data bits of the first serial data byte transmitted have the following significance (the least-significant bit is transmitted first):

Category Codes

Bits 1 through 5 may represent either data to be transmitted or a sub-category code, depending on the states of bits 6 through 8. Bits 6 through 8 represent a category-v code. The specific categories that may be encoded are defined as follows:

Category Code 0—This category is a defined spare.
Category Code 1—The data bits 1 through 5 represent a product code. Product code 0 indicates that the byte following the product code is an expanded product code.
Category Code 2—The data bits 1 through 5 represent a transmitter ID code (for distinguishing between output signals).
Category Code 3—The data bits 1 through 5 represent an angle sensor reading (for subterranean transmitters only).
Category Code 4—The data bits 1 through 5 represent electric field strength.
Category Code 5—The data bits 1 through 5 represent boring tool temperature.
Category Code 6—The data bits 1 through 5 define receiver configuration for analog data.
Category Code 7—Undefined at this time.

For example, an operator may select one of 31 identification (ID) codes that are available to identify a particular transmitter's unique signal (e.g., to distinguish between different lines using that transmitter). Different ID codes may also be used to distinguish between different signals from multiple transmitters or, as disclosed below in another embodiment (with respect to FIG. 17), different ID codes may be provided simultaneously by multiple outputs of a single transmitter. Additionally, the operator may select a product code to transmit along with the carrier signal. A product code identifies a particular type of transmitter (e.g., a particular model aboveground transmitter or a subterranean transmitter). As disclosed in more detail below, digital information in the form of product codes may be transmitted along with the electromagnetic signal impressed on and radiated from an underground line, or radiated from a subterranean transmitter, and detected by a novel receiver which is capable of identifying the type of aboveground or subterranean transmitter from which the signal originated by recognizing the product code. The improved receiver is also capable of automatically and optimally configuring itself to operate compatibly with the particular type of transmitter and accordingly utilize the information impressed on the detected signal by that transmitter.

As described above, in addition to ID codes and product codes, command codes are another type of digital information that can be transmitted along with a carrier signal. A command code may be transmitted that is detected by the receiver of the present invention, which causes the receiver to take some kind of special action. For example, just prior to modulating the transmitted signal with analog information, a command code may be transmitted to the receiver. The command code causes the receiver to reconfigure from a tracing or locating mode of operation and adopt an analog mode of operation, in order to detect the analog information following the command code and couple the information to the receiver's speaker.

Transmission of Audio Information

In order to transmit analog audio information along with the carrier signal, the transmitter operator presses push-to-talk button 121 on microphone 120 (FIG. 14), which is coupled into transmitter 100. Referring to FIGS. 14 and 15, push-to-talk button 121 is connected to OR gate circuit 122 and input buffer 116. OR gate circuit 122 generates an interrupt request (IRQ) which is coupled to the interrupt request port of microcontroller 111. Microcontroller 111 then polls the inputs from keypad 125 and push-to-talk button 121, by using input buffer 116 to determine the source of the interrupt request. Microcontroller 111 then transmits a command code which is generated and transmitted in the manner already described above with respect to the transmission of digital information. The transmitted command code instructs receiver 200 (FIG. 14) to reconfigure, switching from a normal (tracing) mode to an audio mode of operation. This reconfiguration operation is described below in conjunction with the detailed description of receiver 200. Microcontroller 111 then loads a new control byte to control latch 118 which sets the position of switch 173 to connect the output of amplifier 172 to the input of amplifier 174. The output signal from amplifier 174 is then coupled either to antenna 190 or output connector 180 through D/A converter 175, amplifier 176, and the appropriate combination of switches 177, 178 and 179. As long as the transmitter operator presses push-to-talk button 121, microcontroller 111 continues to determine that an interrupt request is being generated by push-to-talk button 121, and microcontroller 111 does not generate any digital codes for transmission.

Modulation of the audio signal is accomplished by coupling the audio signal from microphone 120, through amplifier 171 to the bias input of transconductance amplifier 172. Amplitude variations of the incoming audio signal cause corresponding variations in the current gain of amplifier 172. The variations in current gain are then translated into voltage variations at the output of amplifier 172. Thus, the output signal from transmitter 100 is amplitude modulated by the audio signal from microphone 120.

If the transmitter operator releases push-to-talk button 121, microcontroller 111 ascertains the lack of an interrupt request from push-to-talk button 121 and loads another control byte to control latch 118, which sets the position of switch 173 to disconnect the output of amplifier 172 from the input of amplifier 174. Thus, the unmodulated TX SIGNAL is processed through output circuit 170 to antenna 190 or output connector 180. Microcontroller 111 then generates a command code in the manner described above with respect to the transmission of digital information, which is transmitted to instruct receiver 200 (FIG. 14) to reconfigure, switching from an audio mode back to a normal (tracing) mode of operation.

Transmission of Operating Status Information

Utilizing the audio information transmission capability of the present invention, it is possible to communicate the transmitter's operating status information to a receiver operator. For example, if microcontroller 111 (FIG. 15) determines that the battery supply voltage for (portable) transmitter 100 is too low, transmitter 100 can issue an audio tone (generated by conventional circuitry) or a "beep" which is coupled to transmitter speaker 140. Thus, by listening for the "beeps," the transmitter operator may be kept apprised of the battery voltage level. Also, the battery level information can be converted to digital data and supplied directly to a digital readout at the transmitter.

More importantly, however, the present invention is also capable of transmitting the audio tones or beeps to receiver 200 in order to alert an operator at that location. The receiver operator would be kept apprised of the transmitter's battery voltage level, whereby the transmitter may be left unattended and separated by a great distance from the receiver. Unlike prior art locators that required either a separate operator for each transmitter and receiver, or an operator who was required to return and check the transmitter from time to time, with the present invention it is feasible to utilize only one operator who may set up the transmitter and then trace lines with the receiver at a remote location.

In order to transmit an audio tone or "beep" to receiver 200, microcontroller 111 transmits a command code that instructs receiver 200 to reconfigure or switch from a tracing mode to an audio receiving mode. Microcontroller 111 then synthesizes the audio tone by increasing and decreasing the gain of multiplying D/A converter 175 (FIG. 16) at an audio frequency. The audio tone or signal generated at the output of D/A converter 175 is coupled through amplifier 176 (FIG. 16), switch 177, and either switch 178 or 179 to antenna 190 or output connector 180, respectively. Thus, the audio tone may be transmitted via the signal coupled from the internal antenna to an underground conductive line, or through the direct connection to the underground line. After transmission of the "beep" is completed, microcontroller 111 then transmits another command code that instructs receiver 200 to switch from an audio mode back to a normal (tracing) mode of operation.

Figure 17:
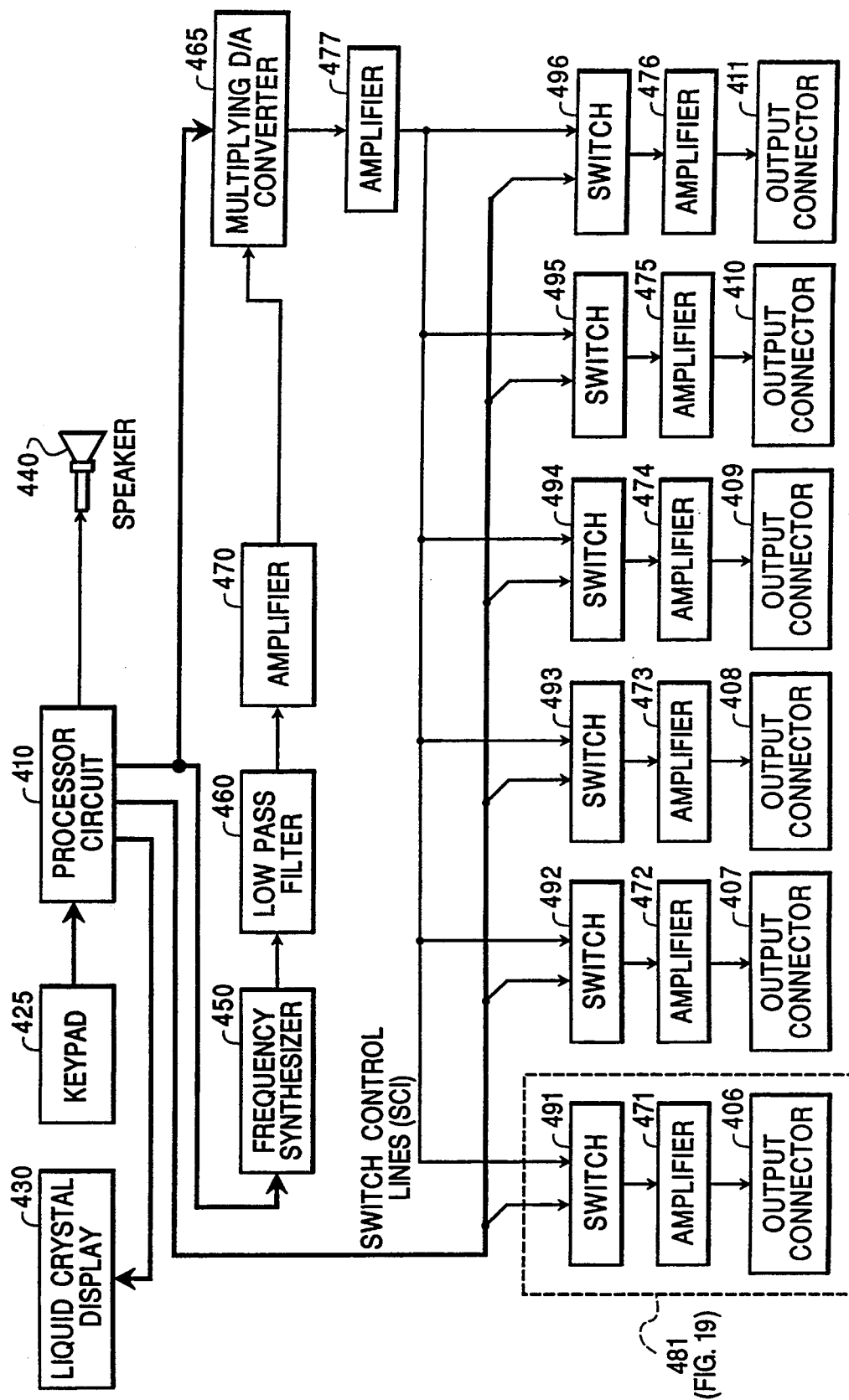
FIG. 17 is an electrical block schematic diagram of a multiple-output locator transmitter in accordance with a second embodiment of the present invention.

An Improved Locator Transmitter For Simultaneously Transmitting Multiple ID Codes FIG. 17 illustrates a simplified electrical block diagram of an improved locator transmitter in accordance with another embodiment of the present invention, which includes a plurality of output connectors that may be simultaneously connected to a plurality of different lines. Transmitter 40, which may be substituted for transmitter 100 in this embodiment, includes processor circuit 410, which coordinates and controls all functions of transmitter 40. The transmitter operator (not shown) inputs commands to transmitter 40 using keypad 425. Transmitter 40 communicates information back to the operator using liquid-crystal display 430 and speaker 440. The signal to be transmitted by transmitter 40 is generated by frequency synthesizer 450, filtered by digitally controlled filter 460, and buffered by buffer amplifier 470, which may, for example, comprise one section of a TLC27L2 type dual operational amplifier. The output of amplifier 470 is supplied as a reference voltage to one channel of D/A converter 465, which may, for example, comprise a TLC7528 type dual multiplying D/A converter. Processor circuit 410 utilizes D/A converter 465 to control the amplitude of the output signals, as disclosed below. The output signal from D/A converter 465 is buffered by amplifier 477, which may, for example, comprise one section of a TLC27L2 type dual operational amplifier. The output of amplifier 477 is coupled to six separate sets of output circuits, comprising switches 491–496, amplifiers 471–476, and output connectors 406–411, respectively.

Figure 18:
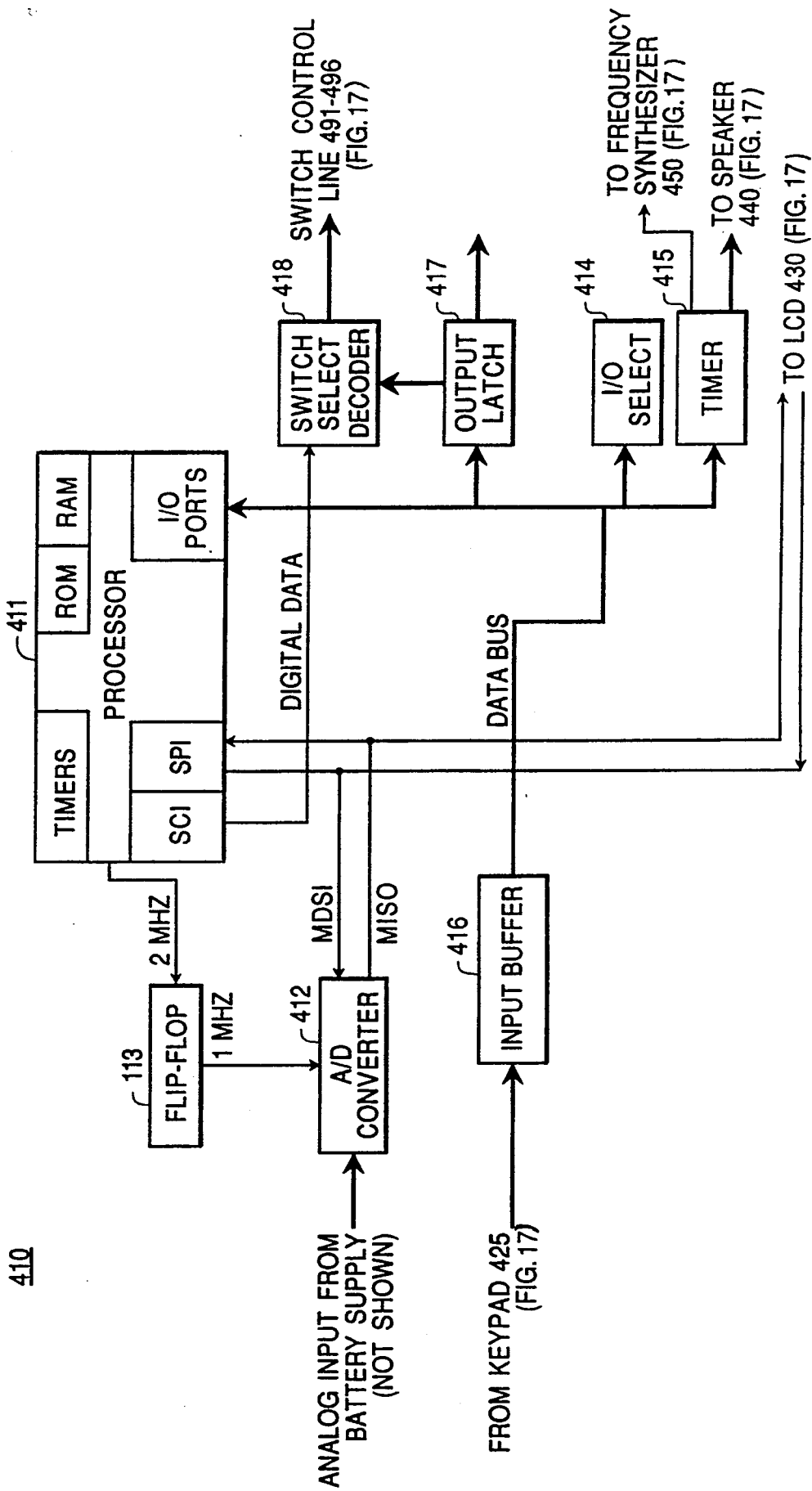
FIG. 18 is an electrical block schematic diagram of the processor circuit of FIG. 17.

The detailed structure of processor circuit 410 is shown in FIG. 18. Referring to FIGS. 17 and 18, microcontroller 411 may, for example, comprise a Motorola MC68HC705C8 type microcontroller including a processor, ROM, RAM, an asynchronous bidirectional SCI integral with a baud rate generator, a synchronous bidirectional SPI, a timer system, and input-output ports (I/O ports). A/D converter 412, which may, for example, comprise a 45040 type 8-bit A/D converter, is coupled to microcontroller 411 through the microcontroller's bidirectional SPI. The 1-MHz clock signal for A/D converter 412 is provided by flip-flop 413, which divides the microcontroller's crystal-controlled clock frequency of 2 MHz in half. I/O select 414, which may, for example, comprise a 74HC138 type 1-of-8 decoder, generates input/output select signals from three of the microcontroller's I/O port lines. Programmable timer 415, which may, for example, comprise an 82C54 type programmable timer, generates a reference frequency signal for frequency synthesizer 450. Input buffer 416 provides an interface between keypad 125 and the data bus in processor circuit 410. Output latch 417, which may, for example, comprise a 74HC374 type latch, latches command bytes from microcontroller 411 provided through the data bus, in order to control output switches 491–496 in FIG. 17. An output signal (digital data) from the SCI is coupled to one of the low-active enable inputs of switch select decoder 418. Also, three bits of output latch 417 are coupled to the address inputs of switch select decoder 418, in order to route the serial data input to one of the six switch control lines in FIG. 17. Each switch control line is connected to a respective one of switches 491–496 in FIG. 17. Programming of liquid-crystal display 430 (FIG. 17) is accomplished by microcontroller 411 via the MISO and MOSI serial data lines from the SPI port.

Figure 19:
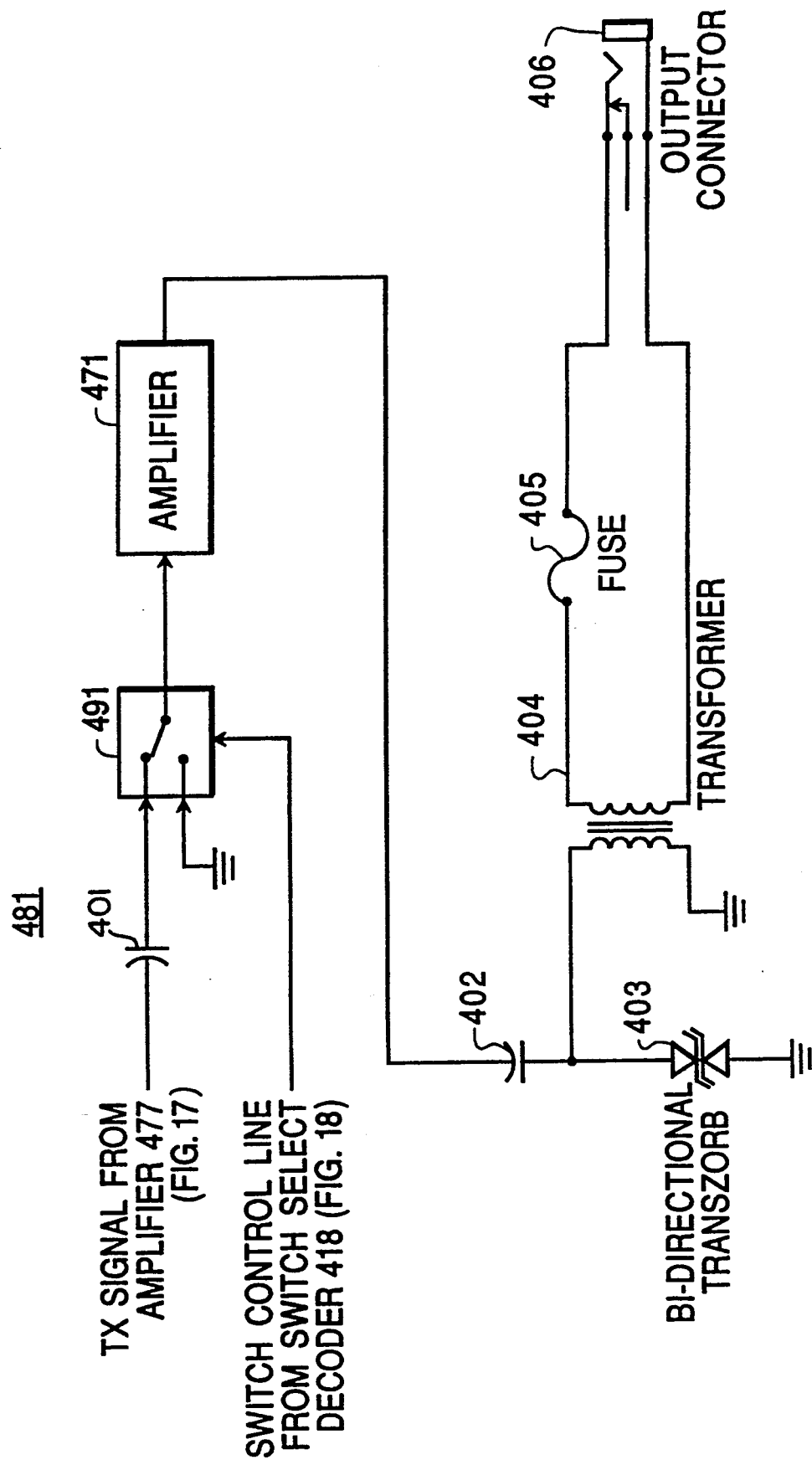
FIG. 19 is an electrical block schematic diagram of one of the identical output circuits of FIG. 17.

For illustrative purposes, the detailed structure of only one of the six identical sets of output circuits (circuit 481) of FIG. 17, is shown in FIG. 19. Referring to FIG. 19, input TX SIGNAL from amplifier 477 is coupled by capacitor 401 to one input of analog switch 491, which may, for example, comprise one section of a 4053 triple 2-channel analog multiplexer. The other input to analog switch 491 is connected to ground. The output of switch 491 is coupled to amplifier 471, which may, for example, comprise an LM388 type power amplifier. The output of amplifier 471 is coupled by capacitor 402 to transformer 404, which is arranged with bidirectional transient absorber (tranzorb) device 403 across the input winding. Bidirectional tranzorb device 403 may, for example, comprise a P6KE16CA type bidirectional transient absorber. The output of transformer 404 is coupled through fuse 405 to output connector 406 in output circuit 481.

In an operation similar to that disclosed with respect to the single output transmitter illustrated in FIG. 14, microcontroller 411 programs D/A converter 465 (FIG. 17) to set an appropriate output signal level. Frequency synthesizer 450 determines the basic frequency of the carrier signal to be transmitted. The output signal from frequency synthesizer 450, which is a square-wave, is coupled to low pass filter 460. Filter 460 removes the harmonics from the square-wave signal and produces a relatively pure, sine-wave output signal.

In order to distinguish between each of the six output signals, microcontroller 411 encodes each signal at respective output connectors 406–411 with a different digital ID code. Microcontroller 411 programs the internal SCI with the correct data format, baud rate, etc. The different ID codes to be transmitted are then coupled to each of output connectors 406–411 in a rotational sequence. In other words, one ID code is coupled to output connector 406, then a second ID code is coupled to output connector 407, and so on. The sequence of ID codes is then repeated for each of the respective output circuits.

To further illustrate one step in the rotational sequence of transmitting ID codes, microcontroller 411 writes a control byte to the address of output latch 417 (FIG. 18). Three bits from output latch 417 are coupled to the address inputs of switch select decoder 418. Switch select decoder 418 selects the appropriate output switch which, in the above-described example, is switch 491. Microcontroller 411 then loads an ID code into the SCI. When the output of the SCI goes low (a logic "one") for the start bit of the ID code, switch select decoder 418 supplies a control signal to switch 491 that connects the input of switch 491 to ground. Conversely, when the output of the SCI goes high (a logic "zero"), the position of switch 491 is set to pass the TX SIGNAL to amplifier 471 and then on to output connector 406. Thus, the position of switch 491 is controlled by the output bit pattern from the SCI, which serves to interrupt or encode the output signal for each addressed output circuit.

An Improved Locator Receiver

Figure 8A:
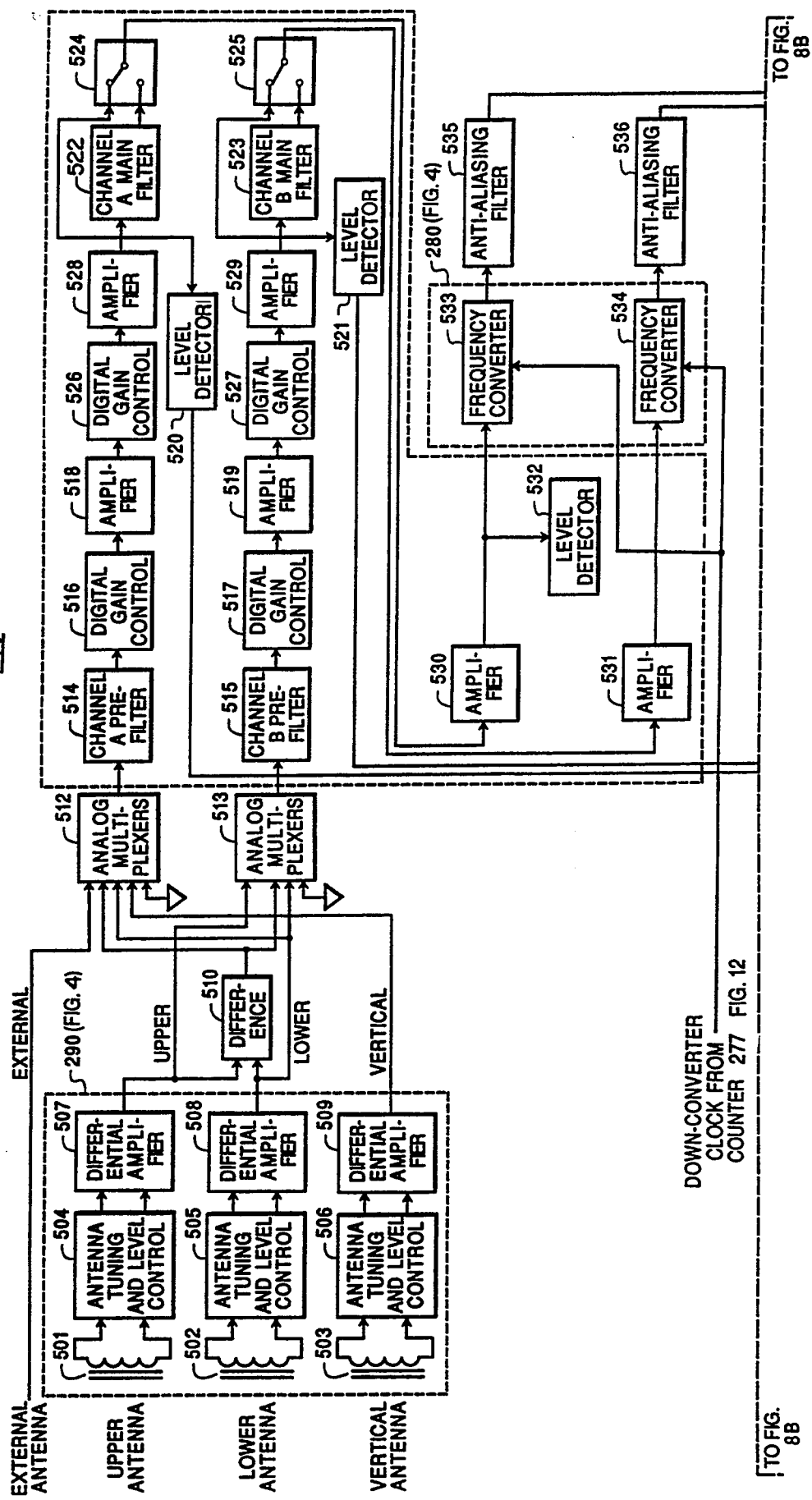
FIGS. 8A and 8B are detailed electrical block schematic diagrams of the locator receiver shown in FIG. 4.
Figure 8B:
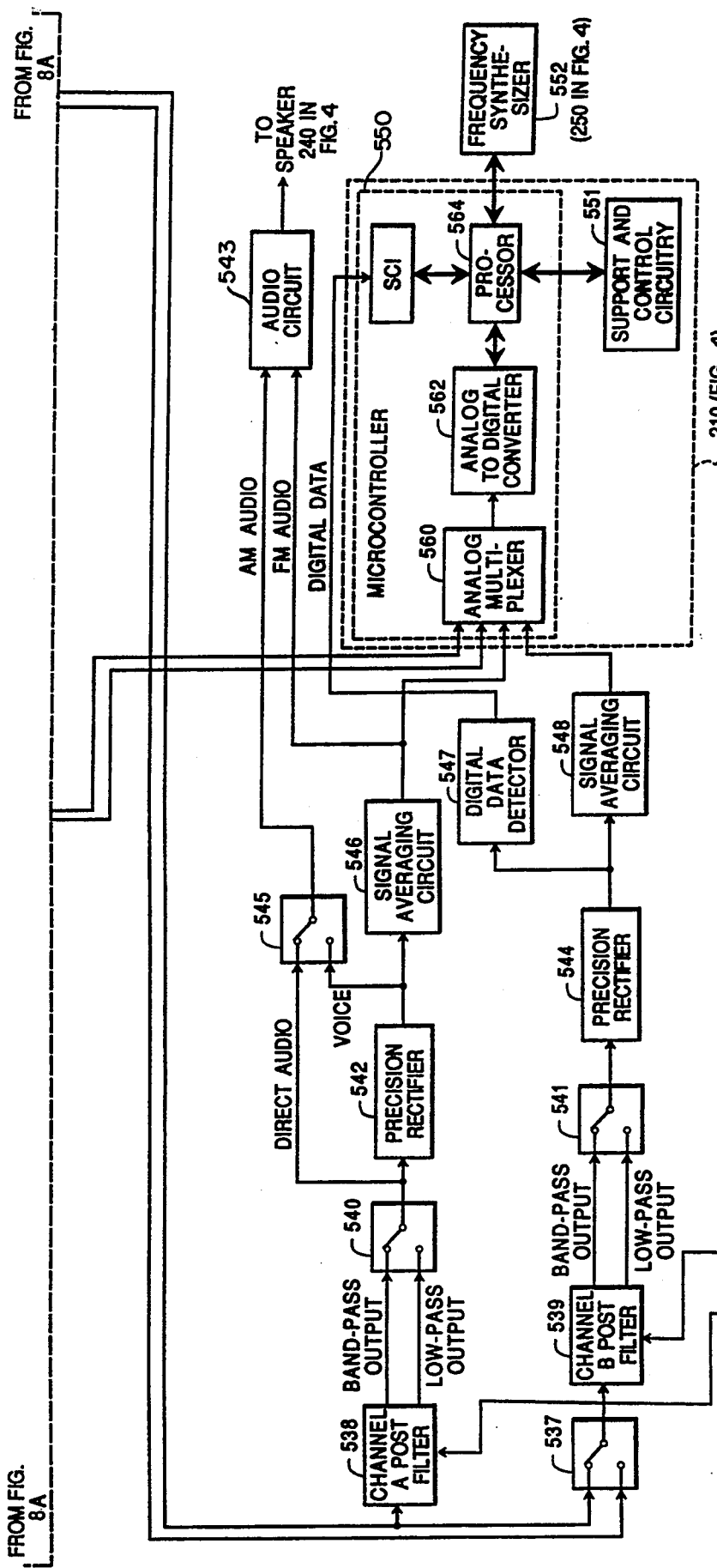

Locator receiver 200 (FIG. 4), which is a preferred embodiment of the present invention, is utilized to receive and process the electromagnetic signals from multiple output transmitter 100. FIG. 8 is a more detailed electrical block diagram of the locator receiver 200 shown in FIG. 4. Referring to FIGS. 8A and 8B, processor circuit 210, which comprises microcontroller 550 and its associated support and control circuitry 551, coordinates and controls all operations of receiver 200. An operator (not shown) inputs commands to receiver 200 using keypad 225 (FIG. 4). Receiver 200 communicates information to the operator through liquid-crystal display 230 and loudspeaker 240 (FIG. 4). The interface circuitry for command and communications between the operator and receiver 200 is disclosed in commonly-assigned, copending U.S. patent application Ser. No. 539,552, entitled "Locator Transmitter Having An Automatically Tuned Antenna", now U.S. Pat. No. 5,231,355, which is expressly incorporated herein by reference.

Referring to FIG. 4, the magnetic component of the electromagnetic field radiated from an underground line (generated by transmitter 100) in accordance with the present invention is detected by antennas 501–503 in antenna circuit 290. The detected signals from antenna circuit 290 are then amplified and filtered within linear signal processor circuit 260. The filtered output signal from linear signal processor circuit 260 is then down-converted to an intermediate frequency (IF) signal by frequency converter 280. Frequency synthesizer 250 provides the signals utilized for the down-conversion process in converter 280 and also for tuning the various fitters in processor circuit 260.

Referring again to FIG. 8A, antennas 501, 502 and 503 are essentially identical in design, but the connections of antenna 501 are reversed with respect to the connections of antenna 502 so as to produce a signal from antenna 501 which is out of phase with the signal from antenna 502 (assuming a common mode magnetic field for both antennas). The signal response of each antenna is tuned or attenuated by respective antenna tuning and level control circuits 504, 505 and 506. The balanced outputs of antenna circuits 504, 505 and 506 are then coupled to the inputs of high gain differential amplifier circuits 507, 508 and 509, respectively. Differential amplifiers 507, 508 and 509 each comprise a combination of MC33078 and MC33172 types operational amplifiers. The signals at the single-ended outputs of differential amplifiers 507, 508 and 509 are labeled UPPER, LOWER and VERTICAL, respectively. The UPPER and LOWER signals from differential amplifiers 507 and 508 are coupled to amplifier 510, which comprises an MC33172 type operational amplifier. Amplifier 510 algebraically combines the UPPER and LOWER signals to produce the sum of their signals. Since the UPPER and LOWER signals are 180 degrees out of phase, the summing operation actually provides a difference signal, labeled DIFFERENCE.

There are two channels in the signal processing circuitry, Channel A and Channel B, with similar circuitry in each. The signals UPPER and LOWER from differential amplifiers 507 and 508, DIFFERENCE from amplifier 510, and VERTICAL from differential amplifier 509 are coupled to the inputs of multiplexers 512 and 513, which comprise 4051 type 8-channel analog multiplexers. Each multiplexer 512 and 513 provides one output signal which is selected from the plurality of input signals by microcontroller 550, as will be explained further below. The output signal from multiplexer 512 is coupled to the first stage of signal processing channel A, while the output signal from multiplexer 513 is coupled to channel B. The selected signals for channels A and B are coupled to prefilters 514 and 515, each of which comprises two sections of an MC33172 type dual operational amplifier. The resulting filtered signals are then coupled to digital gain controls 516 and 517, respectively. Each of digital gain controls 516 and 517 comprises one section of a TLC7528 type multiplying D/A converter. The outputs of digital gain controls 516 and 517 are coupled to respective amplifiers 518 and 519, which comprise MC33172 type operational amplifiers. The outputs of amplifiers 518 and 519 are coupled to digital gain controls 526 and 527, respectively, each of which comprises one section of a TLC7528 multiplying D/A converter. The outputs of digital gain controls 526 and 527 are coupled to respective amplifiers 528 and 529, which comprise MC33172 type operational amplifiers. The outputs of amplifiers 528 and 529 are connected to level detectors 520 and 521, respectively. Level detectors 520 and 521 allow microcontroller 550 to monitor the output signal levels of amplifiers 528 and 529, respectively. Level detectors 520 and 521 comprise passive components normally utilized in a conventional peak detector.

Main filters 522 and 523 comprise LMF100C type switched-capacitor filters including two bandpass sections connected in cascade. Switches 524 and 525 bypass or include a respective main filter 522 or 523. Each switch comprises one section of a 4053 type triple 2-channel analog multiplexer, which is separately controlled by microcontroller 550. A single control line (not shown) from microcontroller 550 switches the Q of both sections of filters 522 and 523 between two sets of predetermined values.

The outputs of switches 524 and 525 are coupled to respective amplifiers 530 and 531, each of which comprises both sections of an MC33172 type dual operational amplifier connected in cascade. Level detector 532, which comprises one section of an LM393 type comparator, is connected to the output of amplifier 530 in channel A. Level detector 532 outputs a logic signal to microcontroller 550 that goes low when the signal in Channel A exceeds a predetermined threshold.

The outputs of amplifiers 530 and 531 are coupled to respective frequency converters 533 and 534. Each frequency converter comprises an MC33172 type operational amplifier connected as an inverter and one section of a 4053 type triple 2-channel analog multiplexer, which switches between an inverted and un-inverted signal at a rate set by frequency synthesizer 250. The outputs of frequency converters 533 and 534 are coupled to respective anti-aliasing filters 535 and 536. Filters 535 and 536 comprise simple RC integrators whose time constants can be changed.

The output of filter 535 is coupled to post-filter 538 and one input of switch 537 (FIG. 8B). The output of filter 536 is coupled to the second input of switch 537 (FIG. 8B). Switch 537 comprises one section of a 4053 type triple 2-channel analog multiplexer. Under the control of microcontroller 550, switch 537 couples either the channel A or channel B signal to post-filter 539. Post-filters 538 and 539 comprise MF5 type switched-capacitor filters that provide both a lowpass and bandpass output. The dual outputs from each of post-filters 538 and 539 are coupled to the dual inputs of switches 540 and 541, respectively. Each of switches 540 and 541 comprise one section of a 4053 type triple 2-channel analog multiplexer. Under the control of microcontroller 550, switches 540 and 541 select either the lowpass or bandpass output from respective post-filters 538 and 539. The control lines from microcontroller 550 that control switches 540 and 541 also control the separate Q of post-filters 538 and 539 by switching between two predetermined values of Q for each post-filter.

The respective outputs of switches 540 and 541 are coupled to precision rectifiers 542 and 544. Each precision rectifier comprises an MC33172 type dual amplifier, wherein one section is utilized as the primary rectifier and the second section buffers the output. The outputs of precision rectifiers 542 and 544 are coupled to respective signal averaging circuits 546 and 548, in which each signal averaging circuit comprises one section of an MC33172 type operational amplifier. The output of precision rectifier 542 is also connected to an input of switch 545.

The output of switch 540 is also coupled to the inputs of switch 545. Switch 545, which comprises one section of a 4053 type triple 2-channel analog multiplexer, selects either the output of switch 540 or the output of precision rectifier 542 to provide the AM audio signal. The input of digital data detector 547 is connected to the output of precision rectifier 544. The details of digital data detector 547 are discussed below with respect to FIG. 13. The output from digital data detector 547 is coupled to the data input of the SCI of microcontroller 550.

Microcontroller 550 comprises a Motorola MC68HC11A8 type microcontroller, which includes an 8-channel analog multiplexer, an A/D converter, an asynchronous SCI, a synchronous SPI, and a timer system. Microcontroller 550 also includes electrically erasable and programmable memory (EEPROM) and RAM. Analog multiplexer 560 selects one of the output signals from level detectors 520 and 521, or from signal averaging circuits 546 and 548. The selected analog signal from analog multiplexer 560 is coupled to A/D converter 562, converted to a digital signal, and input to processor 564. Support and control circuit 551 comprises various microprocessor system components described in more detail below with respect to FIG. 11.

Figure 9:
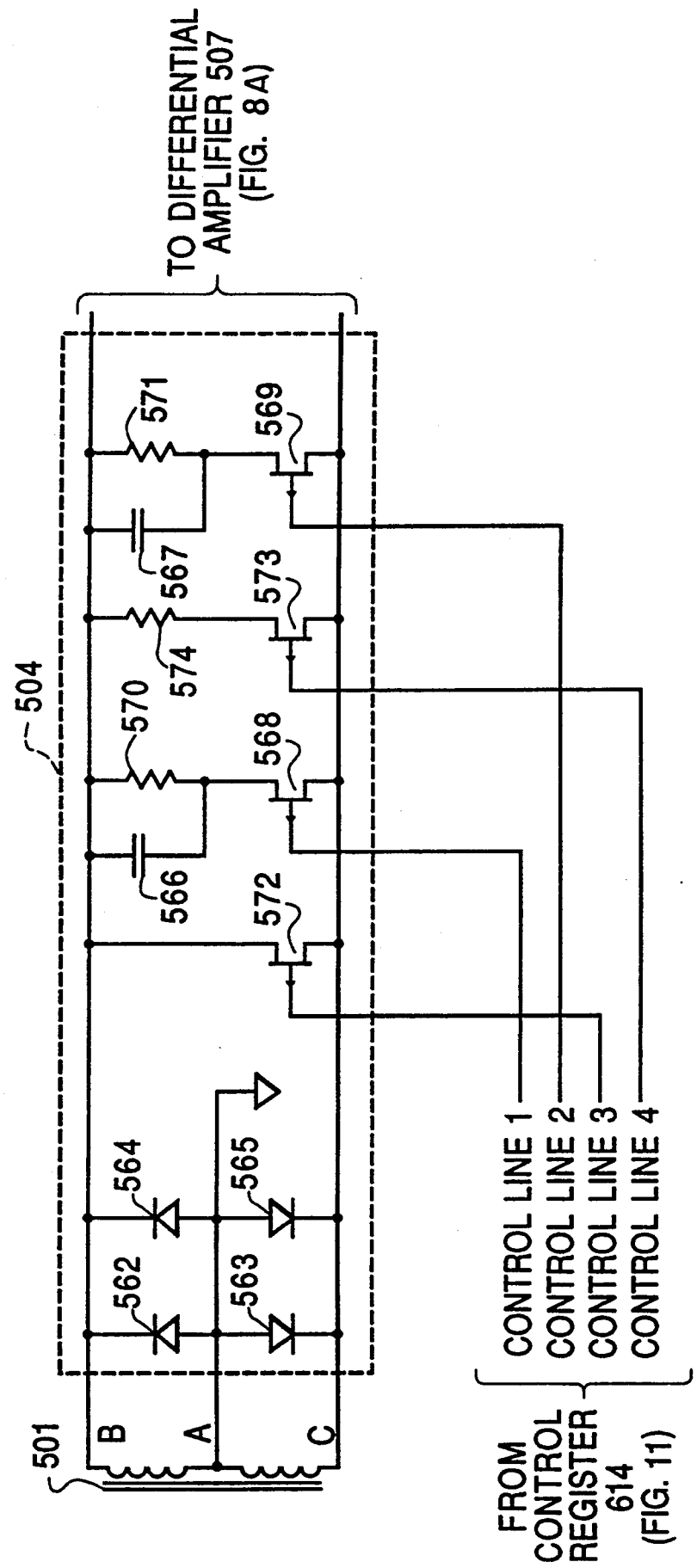
FIG. 9 is a detailed electrical schematic diagram of one of the identical receiver antenna circuits of FIG. 8A.

FIG. 9 is a schematic diagram of antenna tuning circuit 504 in FIG. 8A. Antenna tuning circuit 504 is identical in structure to antenna tuning circuits 505 and 506. Referring to FIG. 9, antenna 501 comprises a center-tapped coil including a ferrite rod to increase the magnetic flux through the coil. Center tap A is connected to ground so that any voltage produced by an ambient electric field in the vicinity of antenna 501 will appear as a common-mode voltage on output taps B and C, and will be rejected by differential amplifier 507. Diodes 562, 563, 564 and 565 protect the antenna circuit from voltage overloads.

Figure 11:
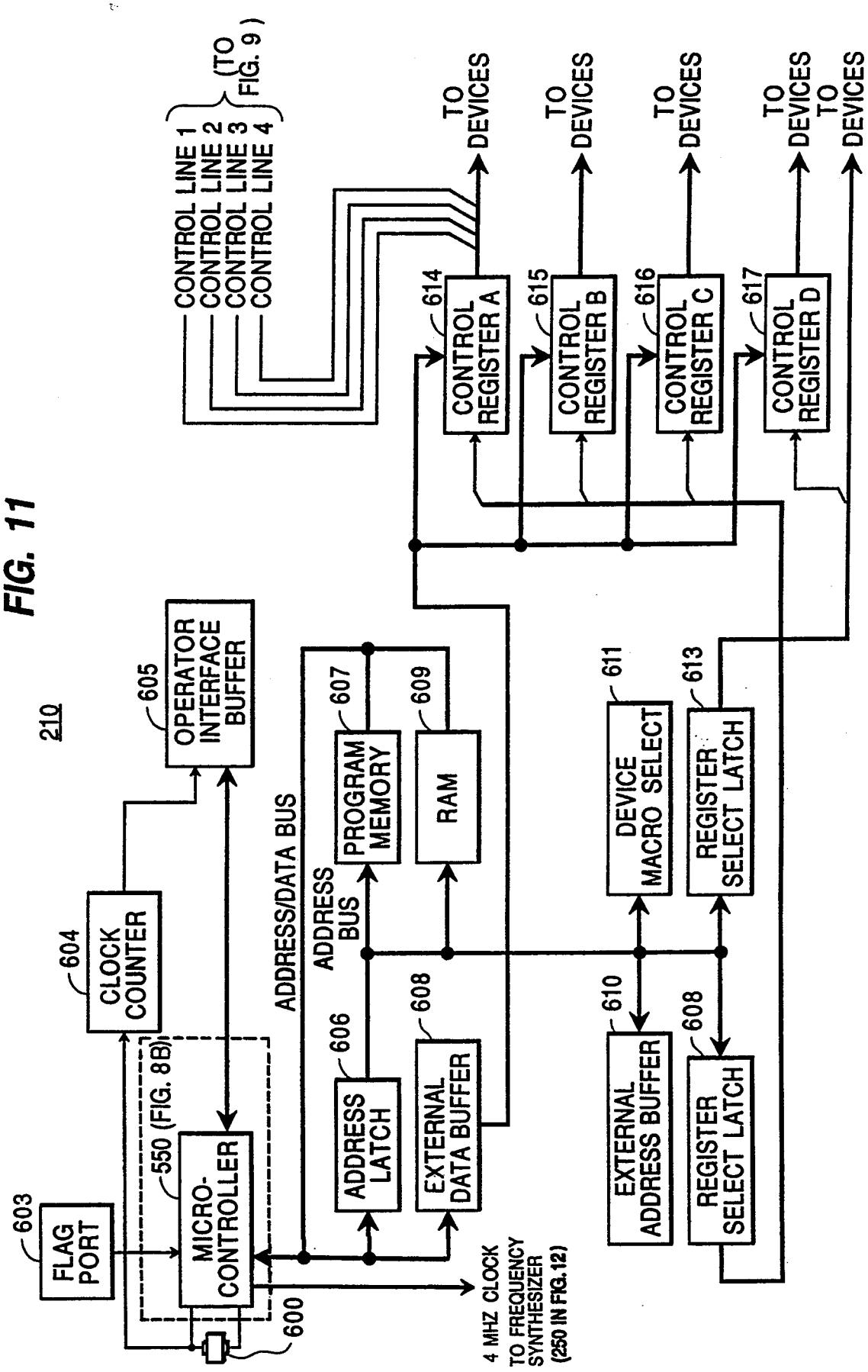
FIG. 11 is a detailed block diagram of the receiver microcontroller and its associated support and control circuits of FIG. 8B.

Antenna 501 is tuned to one of two possible resonant frequencies by switching capacitors 566 and 567 and resistors 570 and 571 in or out of the antenna circuit by gating field-effect transistors 568 and 569, under the control of digital signals CONTROL LINE 1 and CONTROL LINE 2 from control register A in FIG. 11. Resistors 570 and 571 reduce the Q of the circuit and broaden the bandpass centered on each of the two resonant frequencies. By gating field-effect transistor 572, the control signal on CONTROL LINE 3 enables a clamp circuit to short the antenna circuit, and CONTROL LINE 4 enables a fixed attenuator circuit to reduce the sensitivity of the antenna circuit by gating field-effect transistor 573. Further, the antenna circuit may be disabled for automatic test purposes by gating field-effect transistor 572 on.

Figure 10:
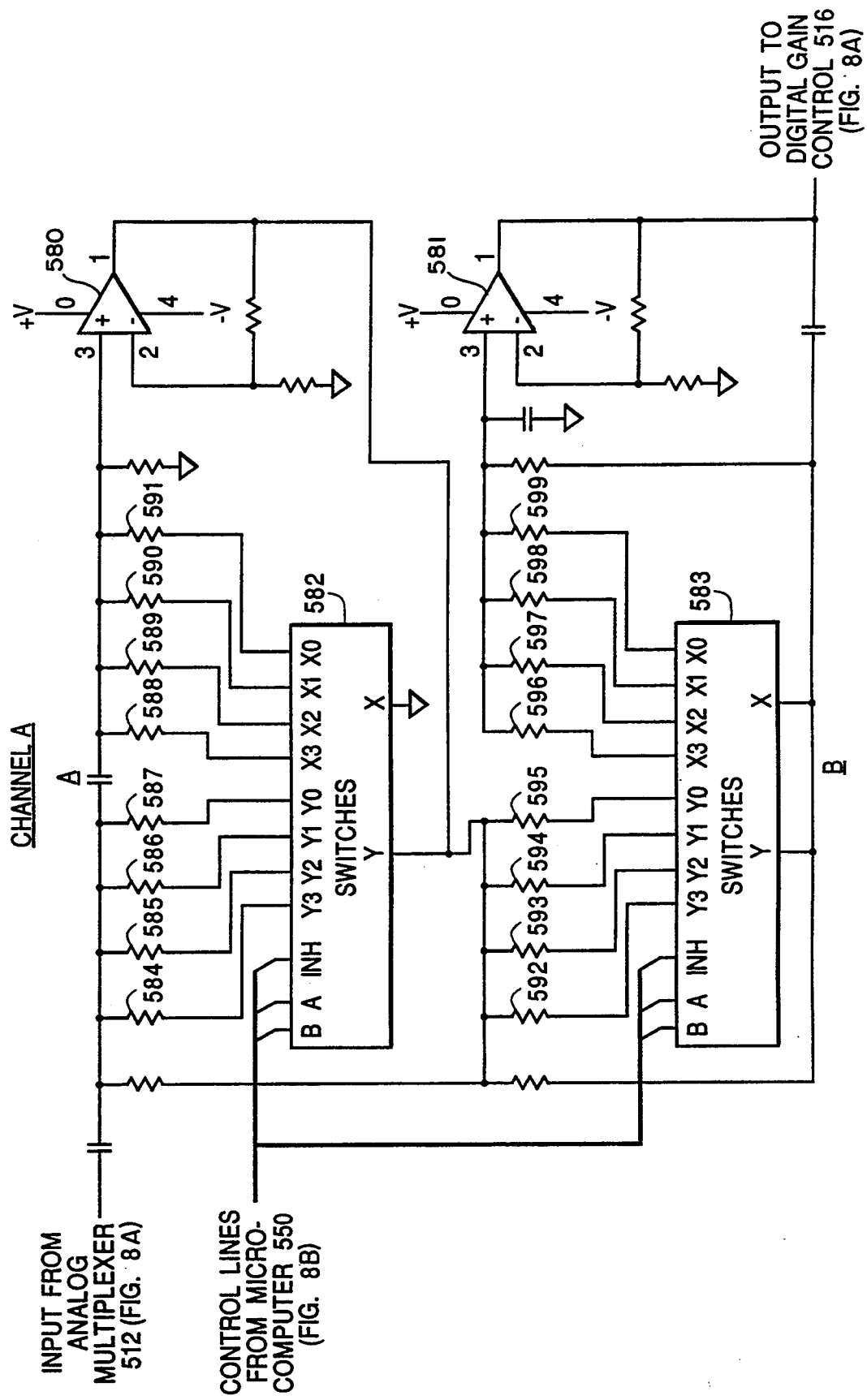
FIG. 10 is an electrical schematic diagram of one of the identical receiver prefilters of FIG. 8A.

FIG. 10 is a schematic diagram of pre-filter 514 in FIG. 8A. The structures of pre-filters 514 and 515 are identical. Referring to FIG. 10, pre-filter 514 is designed as an adjustable, second order, active bandpass filter and comprises an MC33172 type dual operational amplifier. Switch 582, which comprises one section of a 4053 type triple 2-channel analog multiplexer, selects one pair of resistors from pairs of resistors 584 and 588, 585 and 589, 586 and 590, or 587 and 591. Switch 583, which also comprises one section of a 4053 type triple 2-channel analog multiplexer, selects one pair of resistors from pairs of resistors 592 and 596, 593 and 597, 594 and 598, or 595 and 599. Thus, the bandpass of pre-filters 514 and 515 are controlled by selecting the appropriate pairs of resistors with switches 582 and 583.

Figure 13:
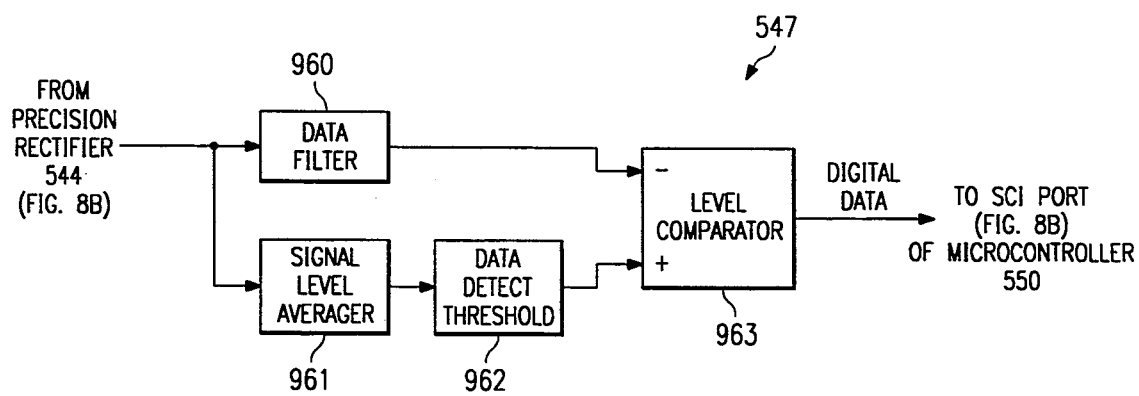
FIG. 13 is a detailed block diagram of the digital data detector of FIG. 8B.

FIG. 13 is a detailed block diagram of digital data detector 547. As described above, the output of precision rectifier 544 (FIG. 8B) is connected to the inputs of data filter 960 and signal level averager 548. The output of data filter 960 is connected to one input of level comparator 963. The output of signal level averager 961 is connected to the input of data detect threshold circuit 962. The output of data detect threshold circuit 962 is connected to the second input of level comparator 963. The output of level comparator 963 is connected to the SCI port of microcontroller 550 in FIG. 8B. The circuit combination of signal level averager 961 and data detect threshold circuit 962 provides a threshold voltage which is approximately 50% of the average incoming signal level from precision rectifier 544. The incoming signal from precision rectifier 544 is filtered by data filter 960, which comprises a second order, lowpass filter. Level comparator 963 quantizes the signal from data filter 960, using the threshold voltage from data detect threshold circuit 962 as a reference.

FIG. 11 is a block diagram of processor circuit 210 (FIG. 4) including microcontroller 550 and its associated support and control circuit 551. The clock rate for microcontroller 550 is set by 4-MHz crystal 602. A signal from crystal 602 is coupled to microcontroller 550 and clock counter 604. Clock counter 604 comprises a 74HC4020 type 14-stage binary counter, which divides the 4-MHz clock frequency to produce lower-frequency clock signals for use in the operator interface circuitry (not shown). The clock signal from clock counter 604 is coupled to operator interface buffer 605. Operator interface buffer 605 is a 74HC244 type digital buffer that acts as a buffer between clock counter 604, microcontroller 550, and keypad 225 and liquid-crystal display 230. Flag port 603 comprises a 74HC354 type multiplexer having output latches, which allows microcontroller 550 to examine the state of level detector 532 in FIG. 8A. Address latch 606 comprises a 74HC373 type latch that de-multiplexes addresses from the multiplexed address/data bus connected to microcontroller 550. The de-multiplexed addresses from latch 606 are coupled to program memory 607, which comprises a 27C128 type programmable read only memory, and also to 6116 RAM chip 609 or the working memory of microcontroller 550. (There is also a small amount of RAM in microcontroller 550 which is used to save configuration data when power is removed from the rest of the circuitry.) External address buffer 610 buffers addresses going to devices on other circuit boards in receiver 200. External data buffer 608 buffers data going to devices on other circuit boards in receiver 200.

Device macro select 611 decodes the addresses of blocks of memory, by receiving the address information from address latch 606 and identifying a block of memory in which a location desired to be addressed is found. These memory blocks include RAM (working memory) 609 and the devices addressed by external address buffer 610. The memory blocks also include register select latches 612 and 613. Register select latch 612 decodes eight groups of 16 addresses each for control registers 614–616. Register select latch 613 decodes another eight groups of 16 addresses for control registers 614–617 and other devices in receiver 200. Each of individual control registers 614–617 are decoded with the least-significant four bits of the address bus. Control lines 1-4 are coupled to antenna tuning circuits 504–506 (FIG. 9).

Referring to FIG. 11, microcontroller 550 controls the actions of the analog circuit by writing control bytes to control registers 614–617. The transmitted signals from transmitter 100 (FIG. 4) are detected by antennas 501, 502 and 503 (FIG. 8A), which are all tuned by two bits in control register 614. A third bit in control register 614 is provided to reduce the sensitivity of antennas 501–503. A fourth bit is provided to disable the antennas. In some operating modes for receiver 200, broadband reception is desired and antennas 501–503 are tuned accordingly. In other operating modes such as, for example, an active locating mode wherein a specific frequency signal is being tracked, it is desirable to tune the receiver to that frequency and reduce the response of the receiver to other frequencies.

Tuning of antennas 501–503 of receiver 200 increases the response to desired signals (selectivity) and decreases the response to out-of-band or interfering signals. The signal-to-noise ratio for the desired signals is also improved significantly in receiver 200, in accordance with the receiver's increased selectivity.

The frequency range of receiver 200 is divided into lower, middle and upper tuning bands, with each band covering about two octaves. When a frequency is selected by the operator, microcontroller 550 determines which band the frequency falls into, and sets either the signal CONTROL LINE 1, CONTROL LINE 2, or does not select either signal (FIG. 11). Microcontroller 550 sets the states of CONTROL LINE 1 and CONTROL LINE 2 by writing a control byte to the address of control register 614, which latches the byte in control register 614. If the bits supplied to CONTROL LINE 1 and CONTROL LINE 2 are both set high, then transistors 568 and 569 (FIG. 9) are turned off and shunt components 566, 567, 570 and 571 are disconnected from the tuning circuit. Thus, the present receiver is capable of digitally controlling the frequency response of the input antenna circuits.

For each of analog multiplexers 512 and 513 (FIG. 8A), one of the input signals is selected for a single output by writing a control byte to the address of a control register in FIG. 11. The signals coupled to the inputs of analog multiplexer 512 (channel A) are LOWER, VERTICAL, EXTERNAL and DIFFERENCE. The other inputs to channel A are connected to ground. The signals coupled to analog multiplexer 513 (channel B) are DIFFERENCE, LOWER and UPPER, with the other inputs connected to ground.

Channel A and Channel B pre-filters 514 and 515 (FIG. 8A) share five common control lines (not shown) from microcontroller 550. Both are enabled or disabled by the first control line, have their upper cutoff frequency set by the second and third control line, and have their lower cutoff frequency set by the fourth and fifth control line.

Referring again to FIGS. 8A and 8B, receiver 200 utilizes the superheterodyne principle of frequency down-conversion with filtering before and after the down-conversion takes place, in order to provide high receiver performance at narrow bandwidths. Signal gain in receiver 200 is controlled by processor 564, which monitors the output signals of digital gain controls 526 and 527, and sets digital gain controls 516, 517, 526 and 527 to keep the channel signals within a range that provides good signal-to-noise ratio but avoids overloading the receiver.

Figure 12:
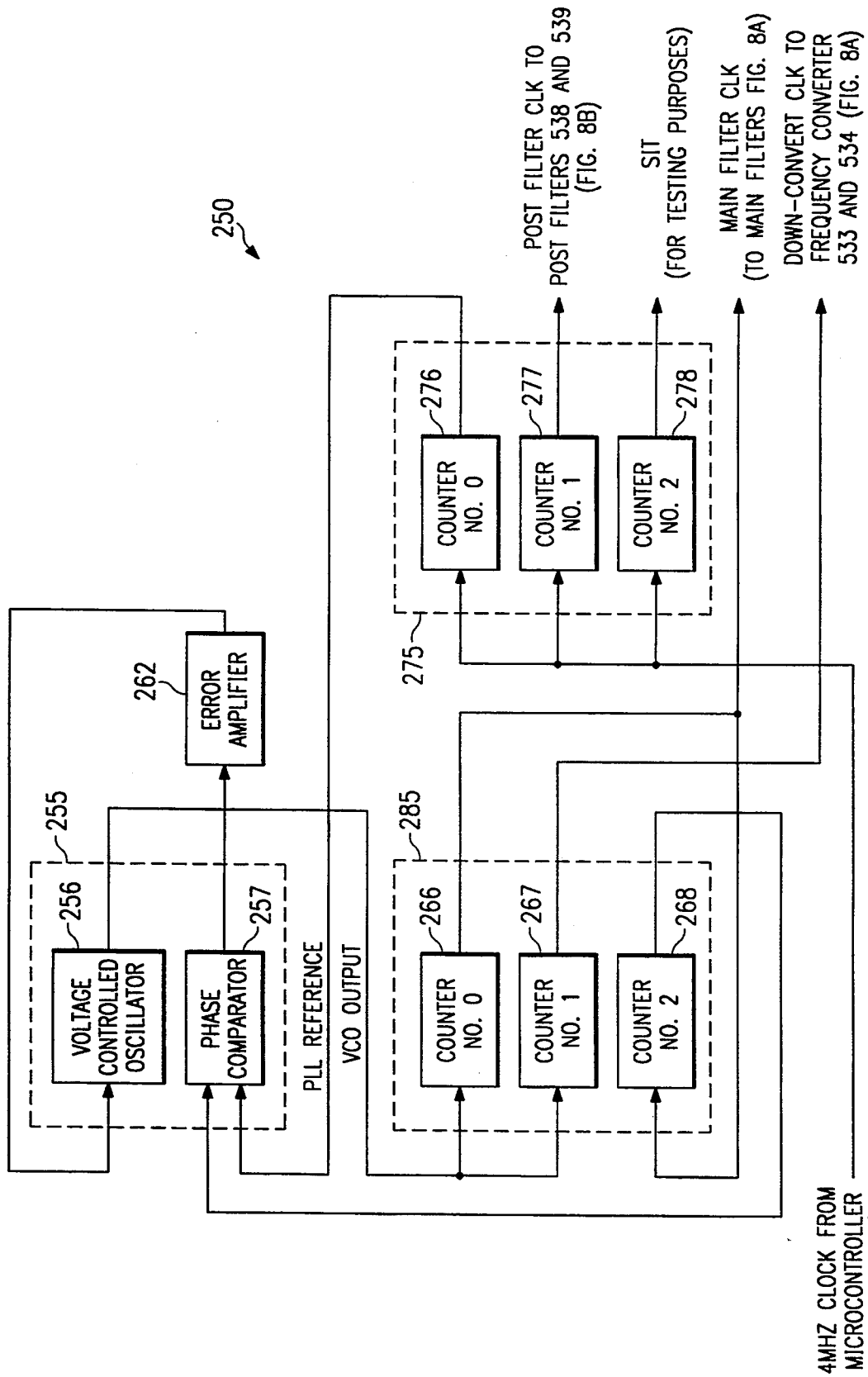
FIG. 12 is a detailed block diagram of the receiver frequency synthesizer of FIG. 8B.

FIG. 12 is a detailed electrical block diagram of frequency synthesizer 250 in FIG. 8B, in accordance with a preferred embodiment of the present invention. Referring to FIG. 12, phase-locked loop 255 comprises a 74HC4046 type phase-locked loop including voltage-controlled oscillator 256 and phase comparator 257. Counter timers 275 and 285 comprise two 82C54 integrated circuits including three 16-bit counters 276–278 and 266–268, respectively, which may be individually controlled and programmed by microcontroller 550 in processor circuit 210 (FIG. 11). Error amplifier 262 comprises one section of an LMC662C dual operational amplifier.

The output signal (VCO OUTPUT) from voltage-controlled oscillator 256 is coupled to the clock inputs of counters 266 and 267. The output of counter 266 is coupled to the input of counter 268. The output of counter 268 is coupled to a signal input of phase comparator 257. The signal 4 MHZ CLOCK from microcontroller 550 in processor circuit 210 (FIG. 11) is coupled to the clock inputs of counters 276, 277 and 278. The output signal PLL REFERENCE of counter 276 is coupled to a second input of phase comparator 257. The output of phase comparator 257 is coupled through error amplifier 262 to the input of voltage-controlled oscillator 256.

For operating as shown in FIG. 12, microcontroller 550 (FIG. 8B) provides control signals (not shown) to counters 266–268 and counters 276–278 to program each of the counters to produce a square-wave output signal having a frequency that is a sub-multiple of the counter's clock input signal frequency. Thus, counter 276 and feedback counter 268 are programmed so as to create a particular voltage-controlled oscillator frequency which, when divided by counters 266 and 267, produces the desired down-convert frequency and main filter clock frequency. The phase-locked loop (PLL) component 255 functions so as to produce signal VCO OUTPUT, which, when divided by counter 285, equals the frequency PLL REFERENCE provided by divider 276. Phase comparator 257 produces an error voltage proportional to the phase error between the two input signals (and frequency error prior to "lock"). This error voltage is then amplified by error amplifier 262 to decrease the phase error between the reference signal and the feedback signal from counter 285. Error amplifier 262 also serves to significantly minimize "phase jitter" introduced by phase comparator 257. Voltage-controlled oscillator 256 produces a frequency proportional to the output of error amplifier 262, which in turn drives feedback counter 285, which generates the feedback signal to phase comparator 257.

There are two basic modes of operation for the PLL frequency synthesizer. One mode is when the phase-locked loop is not "in lock." This occurs immediately following reprogramming of the counters by the microcontroller, prior to the loop's stabilizing. Whenever the counters are reprogrammed, it should be assumed that the frequencies at the input of the phase comparator will be quite different. Phase comparator 257 and error amplifier 262 send a feedback error voltage to voltage-controlled oscillator 256 so as to increase or decrease frequency as required to make the frequency from feedback counter 285 equal to the frequency from reference counter 276. When the two frequencies are equal, phase comparator 257 continues to produce an error voltage, which again is amplified by error amplifier 262, minutely adjusting voltage-controlled oscillator 256 so as to make the phases of the two input signals to phase comparator 257 equal. The resultant signal VCO OUTPUT is divided by counters 267 and 266 to produce the desired down-convert and main filter clock frequencies.

To illustrate the programming of counters 266–268 and counters 276–277 with typical numerical values, assume that receiver 200 is operating in its active locating mode. The programming of counter 278 is not described here, since it is only used for self-integrity testing of receiver 200, which is an operating function disclosed in commonly-assigned, copending U.S. patent application Ser. No. 539,552, entitled "Locator Transmitter Having An Automatically Tuned Antenna", now U.S. Pat. No. 5,231,355, which is expressly incorporated herein by reference. Further assume that the local utility power frequency is 60 Hz, and an operator has selected a nominal receiver frequency of 8 kHz. The precise down-convert frequency desired is 8,160 Hz, and the desired main filter clock is 35 times 8,160 Hz, or 285.60 kHz. Microcontroller 550 finds the correct divisors in the look-up table for 60 Hz and programs reference divider 276 to divide its 4 MHz clock by 7843, producing signal PLL REFERENCE with a frequency of 510 Hz. Similarly, microcontroller 550 programs feedback counter 268 to divide by 560. Thus, signal VCO OUTPUT equals 510 Hz times 560, or 285.60 kHz. Microcontroller 550 programs down-convert divider 267 to divide by 350 and main filter clock divider 266 to divide by 10. These divisions yield a down-convert frequency of 8,160 Hz and a main filter clock frequency of 285.60 kHz, which frequencies are sufficiently close to the desired values.

A novel use of a frequency synthesizer to provide precise clock signals for precisely controlling the frequency response of receiver 200 is an advantageous feature of the present invention. Consequently, the present transmitter frequencies may be precisely selected to avoid interference from extraneous signals, once it is determined what frequencies are desirable in a local environment, and the present receiver may be selectively tuned to the precise transmitted frequencies. Such precision is not provided with conventional locating transmitters and receivers.

It is to be noted that the generation of one set of signal frequencies has been described with respect to receiver frequency synthesizer 250 for illustrative purposes only, but the present invention is not intended to be limited thereto. This frequency synthesizer of the present invention is potentially capable of providing thousands of discrete frequency signals for tuning the center or operating frequency of the receiver. In fact, this feature of the receiver allows an operator to manually step (or "sweep") through a frequency range (essentially a spectrum analysis) to evaluate the ambient noise of the local environment. This allows an identification of the noisy areas to avoid, and "quiet" frequency intervals to utilize for active transmission for the purpose of locating buried lines or subterranean transmitters with this locator system.

Locating Modes of Operation

Receiver 200 provides three operating modes for locating or tracing concealed underground objects: a single antenna mode, a dual antenna mode, and a null mode. In the single antenna mode of operation, only (lower) horizontal antenna 502 (FIG. 8A) is utilized to detect the radiated signal from the underground object to be traced. The signal from antenna 502 is processed through the channel A portion of receiver 200 and detected by a signal detector circuit comprised of precision rectifier 542 and signal averaging circuit 546. The output of this signal detector circuit combination is coupled through analog multiplexer 560 to A/D converter 562 and on to microcontroller 550. Microcontroller 550 scales the detected signal, transforms it to an appropriate signal for display, and provides the transformed signal to liquid-crystal display 230 (FIG. 4). An operator then traces the underground object by observing the displayed signal.

In the dual antenna locating mode, the (upper) horizontal antenna 501 and (lower) antenna 502 are utilized. The signals from antennas 501 and 502 are coupled to difference circuit 510, which provides an output signal DIFFERENCE that is the difference between the upper and lower antenna signals. The DIFFERENCE signal from circuit 510 is processed through the channel A portion of receiver 200, detected by the signal detector combination circuit comprised of precision rectifier 542 and signal averaging circuit 546, and coupled through A/D converter 562 to microcontroller 550. The detected signal is transformed and then displayed at liquid-crystal display 230.

In the null locating mode of operation, (vertical) antenna 503 is utilized. When the axis of antenna 503 is physically oriented to point directly at the radiated signal source, the output signal from antenna 503 is reduced to "zero" or a null response, because the direction of the magnetic lines of flux are orthogonal to the axis of antenna 503. This null signal is coupled through channel A, detected by the above-described signal detector combination circuit, and then coupled to microcontroller 550, whereby an operator locates and traces the underground object by following the null (reduction in signal) as it is displayed at liquid-crystal display 230.

In order to measure the depth of an underground object, the detected signals from both horizontal antennas 501 and 502 are utilized. The signal LOWER from antenna 502 is processed through the channel A circuitry, and the signal UPPER is processed through the channel B circuitry. The two signals are detected by the respective combination signal detectors comprised of precision rectifier 542 and signal averaging circuit 546 for channel A, and precision rectifier 544 and signal averaging circuit 548 for channel B. Each detected signal is then coupled through A/D converter 562 to microcontroller 550. The depth of (i.e., the distance to) the radiating signal source (underground object) is computed by microcontroller 550, by calculating the ratio of the signal from channel A relative to the signal from channel B. The ratio is multiplied by a correction coefficient, which compensates for gain error differences between channels A and B. The result is subtracted from "1" and the reciprocal is derived. This result is then multiplied by a coefficient equal to the distance between the axes of antennas 501 and 502. Thus, the distance to the underground object is derived.

This invention has been described in detail in connection with the preferred embodiments but is for illustrative purposes only and the invention is not limited thereto. It will be easily understood by those skilled in the art that variations and modifications can easily be made within the scope of this invention as defined by the appended claims.

What is claimed is:

1. A locator system for use in locating and distinguishing between a plurality of underground objects by detecting a plurality of electromagnetic signals radiated from said plurality of underground objects, each of said plurality of electromagnetic signals having a given frequency, the frequency of each of said electromagnetic signals being individually selectable, said system comprising:

programmable generating means for generating said plurality of electrical signals, where each electrical signal can be of a different frequency, and when said electrical signals are coupled to respective underground objects, corresponding electromagnetic signals are radiated from said plurality of underground objects, said programmable generating means further comprising respective signal sources for generating said plurality of electrical signals;

a processor responsive to a command for programming the programmable generating means to select frequencies for generation by the programmable generating means;

means for coupling each selected electrical signal to a different one of said plurality of underground objects such that a different electromagnetic signal is simultaneously radiated from each underground object of said plurality of underground objects; and at least one receiver means movable above the ground in the vicinity of the underground objects for detecting one electromagnetic signal and reject detecting of the other radiated electromagnetic signals in order to locate and distinguish between said plurality of underground objects.

2. A locator system for locating and distinguishing between a plurality of underground objects, said system comprising:

multi-frequency signal generator means adapted for generating a first plurality of signals of different frequencies;

selector means for identifying signals of different frequencies of said signal generator means from the first plurality of signals, whereby said signal generator means generates the different frequencies identified;

transmitting means for transmitting said identified signals, said transmitting means having a plurality of outputs for simultaneously transmitting identified signals of different frequencies;

output coupling means for coupling said identified signals from said multi-frequency signal generator means to said transmitting means so that the transmitter means transmits the respective identified signals to the respective outputs of the transmitter means;

transmitter coupling means coupled to said plurality of outputs of said transmitting means for coupling the transmitted signals to said plurality of underground objects for radiating said identified signals from said plurality of underground objects;

receiver sensing means for sensing at least one of the radiated signals and producing a representative signal representing one of said sensed radiated signals receiver amplifying means for amplifying said representative signal;

receiver gain control means for controlling the gain of said amplified representative signal; and receiver identifying means coupled to said amplifying means for identifying the frequency of said sensed radiated signals from said amplified representative signal and distinguishing the identified signal from other signals radiated from the underground objects.

3. The locator system according to claim 2 wherein said multi-frequency signal generator means comprises at least one frequency synthesizer means.

4. The locator system according to claim 2 wherein said multi-signal selector means comprises a microprocessing means.

5. The locator system according to claim 2 further including output control means coupled to said transmitter for controlling the power of the transmitted signals.

6. The locator system according to claim 2 wherein said selector means automatically identifies a signal frequency that is electrically separated from a power line signal harmonic frequency.

7. A method for use in a system for locating and distinguishing between a plurality of underground objects, said method comprising the steps of:

generating a first plurality of signals of different frequencies with a multi-frequency generator;

selecting signals of different frequencies from the first plurality of signals;

coupling each said selected signal generated by said multi-frequency signal generator to a respective transmitter of a plurality of transmitters;

coupling each transmitted signal from a respective transmitter to a different one of said plurality of underground objects such that said transmitted signals cause respective electromagnetic radiations from said underground objects;

moving a receiver above ground in the vicinity of the underground objects;

sensing the electromagnetic radiations radiate therefrom and producing a representative signal representing at least one of said sensed electromagnetic radiations;

amplifying said representative signal with an amplifier;

controlling the gain of said amplified representative signal;

determining the frequency of said representative signal; and providing to a user an indication of the frequency of the sensed representative signal.

8. A transmitter for use in a system for locating and distinguishing between a plurality of underground objects, said transmitter comprising:

multi-frequency signal generator means adapted for generating a range of signals of different frequencies;

programming means for programming said multi-frequency signal generator to produce plural, different signals of different frequencies from said range of signal frequencies;

transmitting means having multiple outputs for respectively transmitting said programmed signals so that each said transmitter means output transmits a different frequency;

coupling means for coupling said selected signals from said multi-frequency signal generator means to said transmitting means; and radiating means coupling said plurality of outputs of said transmitting means to said plurality of underground objects for causing electromagnetic signals of different frequencies to be radiated respectively from said plurality of underground objects.

9. A method for use with a transmitter used for locating and distinguishing between a plurality of underground objects, said method comprising the steps of:

programming a multi-frequency generator capable of generating a range of frequencies to generate a subset of frequencies defining a first plurality of digital signals, each characterized by a different frequency;

filtering each frequency of the subset with a different filter;

programming each filter individually to provide a corresponding analog signal output therefrom;

transmitting each said analog signal from said programmed filters to a different output of a plurality of outputs; and coupling each said transmitted signal to a different underground object such that said analog signals radiate from said plurality of underground objects.

10. A locator system for use in locating a plurality of underground objects, said system comprising:

a transmitter including,
at least one frequency synthesizer for generating a subset of different frequencies from a plurality of precisely defined available frequencies;
transmitting means for transmitting the subset of frequencies to said plurality of underground objects such that each said underground object radiates a respective frequency of the subset; and a receiver including,
a frequency synthesizer programmable to produce different and precise frequencies for tuning the receiver to a narrow band pass to process any one of the radiated frequencies and reject the other radiated frequencies.

11. The locator system according to claim 1 wherein said programmable generating means comprises a plurality of frequency synthesizers, and each said frequency synthesizer is uniquely associated with an output of the programmable generating means.

12. The locator system according to claim 1 wherein said programmable generating means generates an output digital signal of a programmed frequency, and further including a programmable filter for converting the digital signal to a corresponding analog signal.

13. The locator system according to claim 1 wherein said programmable generating means generates a precision frequency electrical signal, and said receiver means includes a band pass filter to pass the frequency of the radiated electromagnetic signal and reject similar frequencies of interference signals.

14. The locator system according to claim 13 wherein said receiver means band pass filter is programmable according to the frequency of the radiated electromagnetic signals received by the receiver means.

15. The locator system according to claim 14 wherein said receiver means further includes an antenna that is programmably tuned according to the frequency of the radiated electromagnetic signals received by the receiver means.

16. A method of locating a plurality of underground conductors using a locator system employing a transmitter and a receiver, comprising the steps of:

a) selecting plural different frequencies to be transmitted by the transmitter;

b) generating the plural different frequencies by the transmitter;

individually filtering the plural different frequencies to define analog waveforms of the plural different frequencies;

d) amplifying the plural analog waveforms of the different frequencies;

e) coupling each amplified analog waveform to a different one of said underground conductors so that the frequencies are simultaneously radiated respectively from the respective underground conductors;

f) selecting in the receiver one of the plural frequencies coupled to the underground conductors so that the receiver senses the selected frequency and rejects other frequencies;

g) carrying the receiver above ground in the vicinity of the underground conductors;

h) providing in the receiver an indication of the proximity of the underground conductor radiating the frequency selected in the receiver;

i) selecting in the receiver another one of the plural frequencies coupled to the underground conductors; and j) repeating steps g) and h).

* * * * *

UNITED STATES PATENT AND TRADEMARK OFFICE
CERTIFICATE OF CORRECTION

PATENT NO. : 5,361,029
DATED : November 1, 1994
INVENTOR(S) : Alan J. Rider, et. al.

It is certified that error appears in the above-indentified patent and that said Letters Patent is hereby corrected as shown below:

Column 26, lines 3-4, after "signals", insert a semicolon--.

Column 28, line 28, before "individually", insert --c) --.

Signed and Sealed this

First Day of August, 1995

Attest:

Attesting Officer

BRUCE LEHMAN

Commissioner of Patents and Trademarks

UNITED STATES PATENT AND TRADEMARK OFFICE
CERTIFICATE OF CORRECTION

PATENT NO. : 5,361,029

DATED : November 1, 1994

INVENTOR(S) : Alan J. Rider, et al.

It is certified that error appears in the above-indentified patent and that said Letters Patent is hereby corrected as shown below:

Column 26, line 47, delete "radiate", insert --radiated--.

Signed and Sealed this

Ninth Day of January, 1996

Attest:

BRUCE LEHMAN

*Attesting Officer*     *Commissioner of Patents and Trademarks*